United States Patent
Chen et al.

(10) Patent No.: US 7,061,798 B2
(45) Date of Patent: *Jun. 13, 2006

(54) OPERATING TECHNIQUES FOR REDUCING EFFECTS OF COUPLING BETWEEN STORAGE ELEMENTS OF A NON-VOLATILE MEMORY OPERATED IN MULTIPLE DATA STATES

(75) Inventors: Jian Chen, San Jose, CA (US); Tomoharu Tanaka, Yokohama (JP); Yupin Fong, Fremont, CA (US); Khandker N. Quader, Sunnyvale, CA (US)

(73) Assignees: SanDisk Corporation, Sunnyvale, CA (US); Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/966,451

(22) Filed: Oct. 15, 2004

(65) Prior Publication Data
US 2005/0047223 A1 Mar. 3, 2005

Related U.S. Application Data

(63) Continuation of application No. 10/323,534, filed on Dec. 18, 2002, now Pat. No. 6,807,095, which is a continuation of application No. 09/893,277, filed on Jun. 27, 2001, now Pat. No. 6,522,580.

(51) Int. Cl.
*G11C 16/34* (2006.01)
(52) U.S. Cl. .......................... 365/185.02; 365/185.03; 365/185.22; 365/185.18; 365/185.17
(58) Field of Classification Search ........... 365/185.02, 365/185.03, 185.17, 185.18, 185.22
See application file for complete search history.

(56) References Cited

U.S. PATENT DOCUMENTS

| 5,095,344 A | 3/1992 | Harari ........................ 257/328 |
| 5,172,338 A | 12/1992 | Mehrotra et al. ....... 365/185.03 |
| 5,430,859 A | 7/1995 | Norman et al. ............. 711/103 |
| 5,570,315 A | 10/1996 | Tanaka et al. ......... 365/185.22 |
| 5,602,987 A | 2/1997 | Harari et al. .................. 714/8 |
| 5,657,332 A | 8/1997 | Auclair et al. .............. 714/763 |
| 5,663,901 A | 9/1997 | Wallace et al. ............... 365/52 |

(Continued)

FOREIGN PATENT DOCUMENTS

JP   10228784   8/1998

OTHER PUBLICATIONS

European Search Report corresponding to Application No: EP 02254491, Mar. 11, 2004, 1 page.

(Continued)

*Primary Examiner*—Andrew Q. Tran
(74) *Attorney, Agent, or Firm*—Parsons Hsue & de Runtz LLP

(57) ABSTRACT

A non-volatile memory system having an array of memory cells with at least one storage element each is operated with a plurality of storage level ranges per storage element. A flash electrically erasable and programmable read only memory (EEPROM) is an example, wherein the storage elements are electrically floating gates. The memory is operated to minimize the effect of charge coupled between adjacent floating gates, by programming some cells a second time after adjacent cells have been programmed. The second programming step also compacts a distribution of charge levels within at least some of the programming states. This increases the separation between states and/or allows more states to be included within a given storage window. An implementation that is described is for a NAND type of flash EEPROM.

14 Claims, 23 Drawing Sheets

U.S. PATENT DOCUMENTS

| | | | |
|---|---|---|---|
| 5,712,180 A | 1/1998 | Guterman et al. | 438/263 |
| 5,768,191 A | 6/1998 | Choi et al. | 365/185.22 |
| 5,774,397 A | 6/1998 | Endoh et al. | 365/185.19 |
| 5,867,429 A | 2/1999 | Chen et al. | 365/185.33 |
| 5,890,192 A | 3/1999 | Lee et al. | 711/103 |
| 5,926,409 A | 7/1999 | Engh et al. | 365/185.03 |
| 6,046,935 A | 4/2000 | Takeuchi et al. | 365/185.03 |
| 6,091,640 A | 7/2000 | Kawahara et al. | 365/185.28 |
| 6,108,238 A | 8/2000 | Nakamura et al. | 365/185.22 |
| 6,151,248 A | 11/2000 | Harari et al. | 365/185.14 |
| 6,243,290 B1 | 6/2001 | Kurata et al. | 365/185.03 |
| 6,373,746 B1 | 4/2002 | Takeuchi et al. | 365/185.03 |
| 6,426,893 B1 | 7/2002 | Conley et al. | 365/185.11 |
| 6,456,528 B1 | 9/2002 | Chen | 365/185.03 |
| 6,522,580 B1 | 2/2003 | Chen et al. | 365/185.02 |
| 6,717,847 B1 | 4/2004 | Chen | 365/185.03 |
| 6,807,095 B1 | 10/2004 | Chen et al. | 365/185.02 |

OTHER PUBLICATIONS

SanDisk Corporation, "Description of SanDisk 64 Megabyte Memory Product Existing Before the Year 2000." Aug. 21, 2002, 2 pages.

Hemink, G.J., et al., "Fast and Accurate Programming Method for Multi-level NAND EEPROMs," *Digest of 1995 Symposium on VLSI Technology*, pp. 129-130.

Takeuchi, Ken, et al., "A Multi-page Cell Architecture for High-Speed Programming Multi-Level NAND Flash Memories," *1997 Symposium on VLSI Circuits Digest of Technical Papers*, Jun. 12-14, 1997, pp. 67-68.

Tanaka, Tomoharu, et al., "A 3.4-Mbyte/sec Programming 3-Level NAND Flash Memory Saving 40% Die Size Per Bit," *1997 Symposium on VLSI Circuits Digest of Technical Papers*, June. 12-14, 1997, pp. 66-66.

Moon, Yong, et al, "Efficient Charge Recovery Logic," *1995 Symposium on VLSI Circuits Digest of Technical Papers*, Jun. 8-10, 1995, pp. 129-130.

Choi, Young-Joon, et al, "A High Speed Programming Scheme for Multi-Level NAND Flash Memory," Moon, Yong, et al, "Efficient Charge Recovery Logic," *1996 Symposium on VLSI Circuits Digest of Technical Papers*, Jun. 13-15, 1996, pp. 170-171.

European Patent Office, "Communication Pursuant to Article 96(2) EPC (Examiner's Substantive Report)", mailed in related European application No. 02 254 491.0-2210 on Jan. 13, 2005, 5 pages.

European Patent Office, "Communication pursuant to Article 96(2) EPC", mailed in related European patent applicaton No. 02 254 491.0 on Sep. 8, 2005, 4 pp.

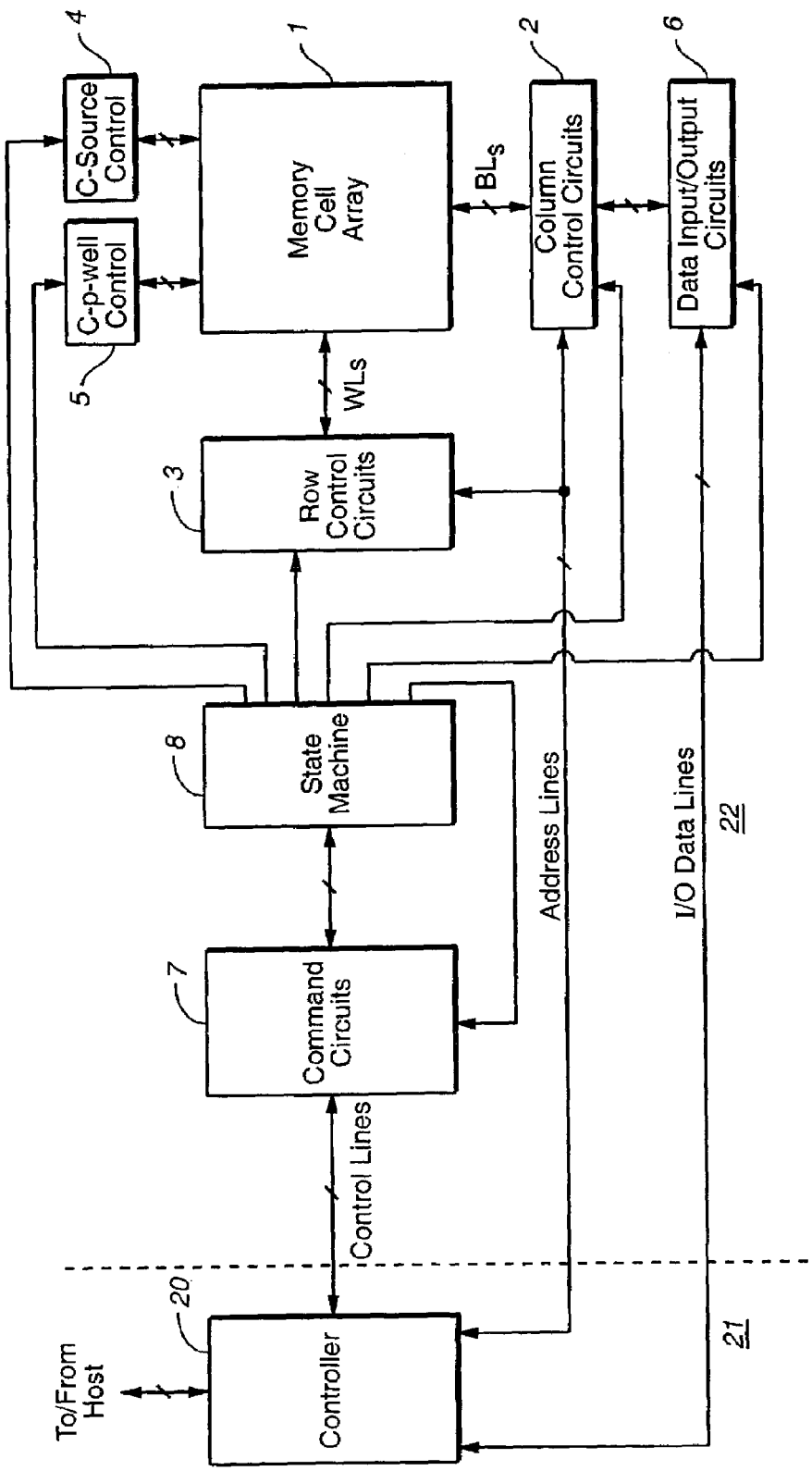
FIG._1

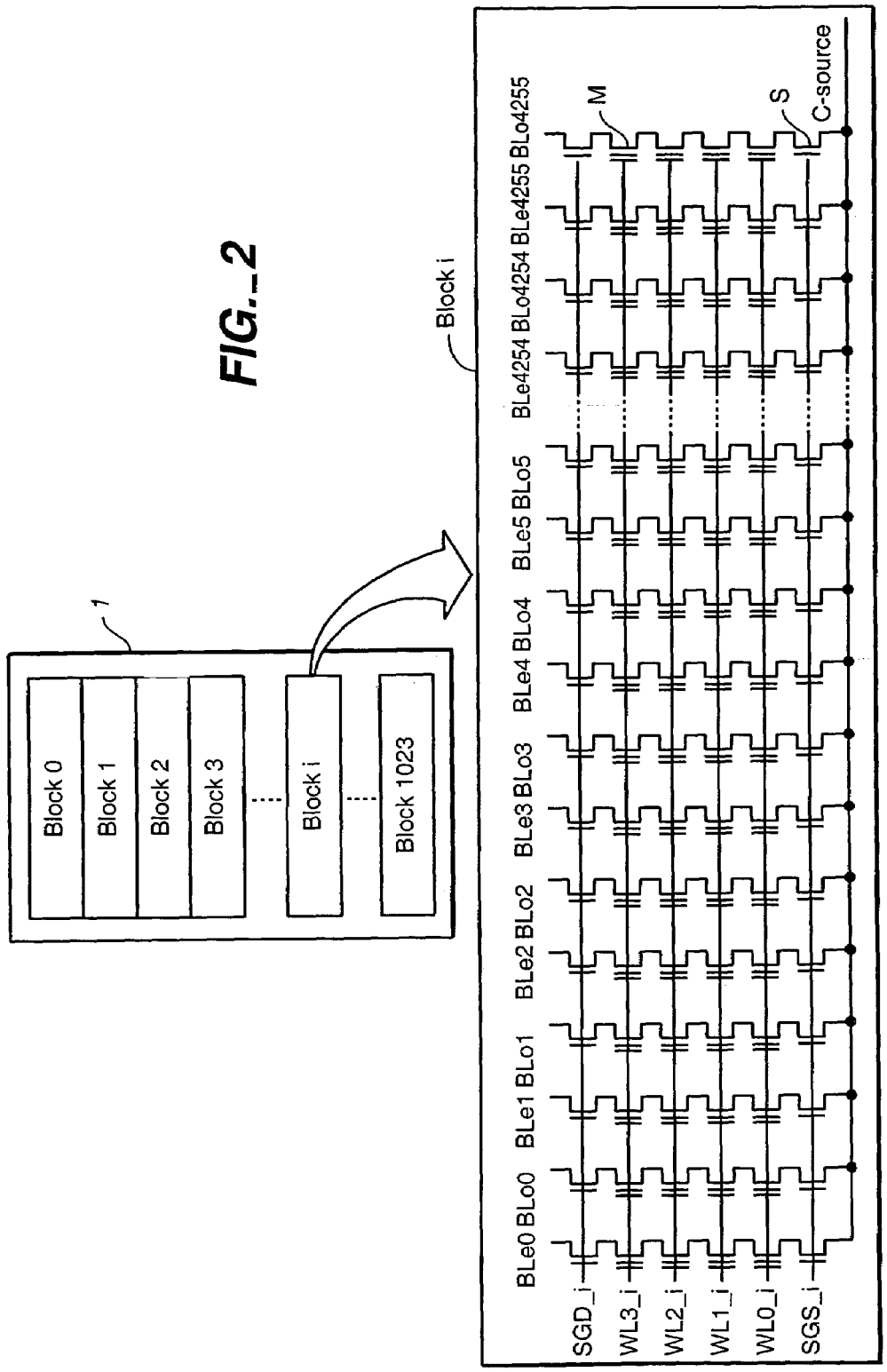
FIG._2

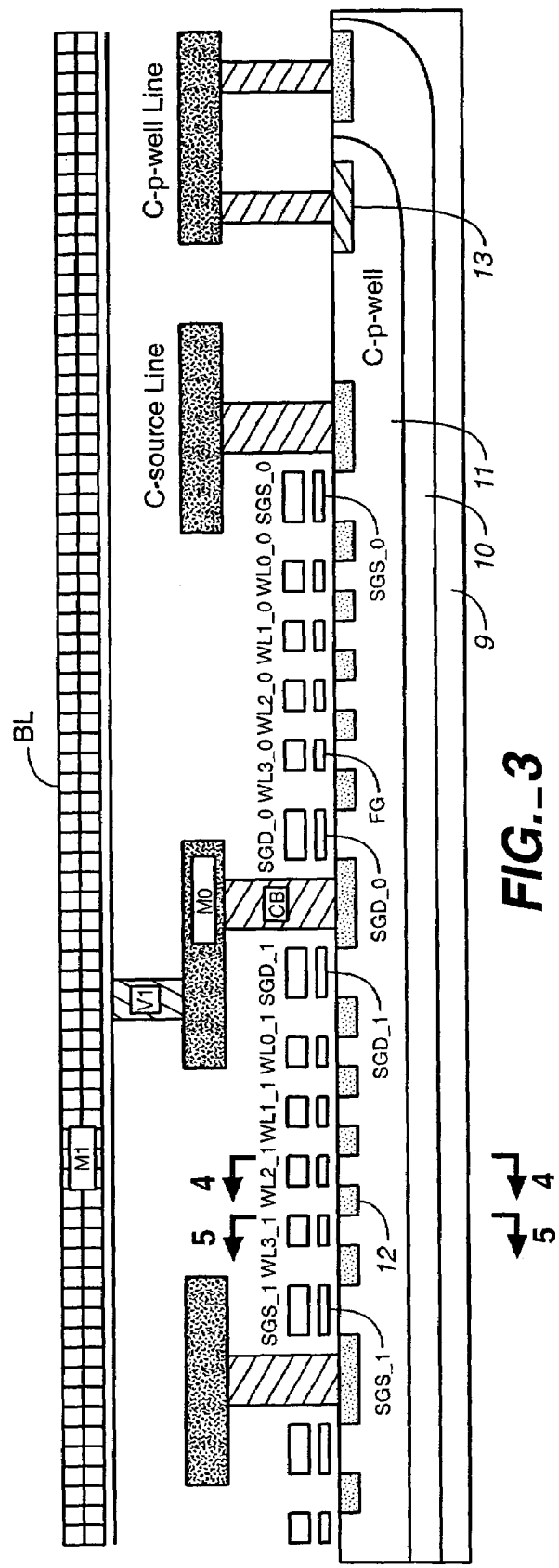
FIG._3

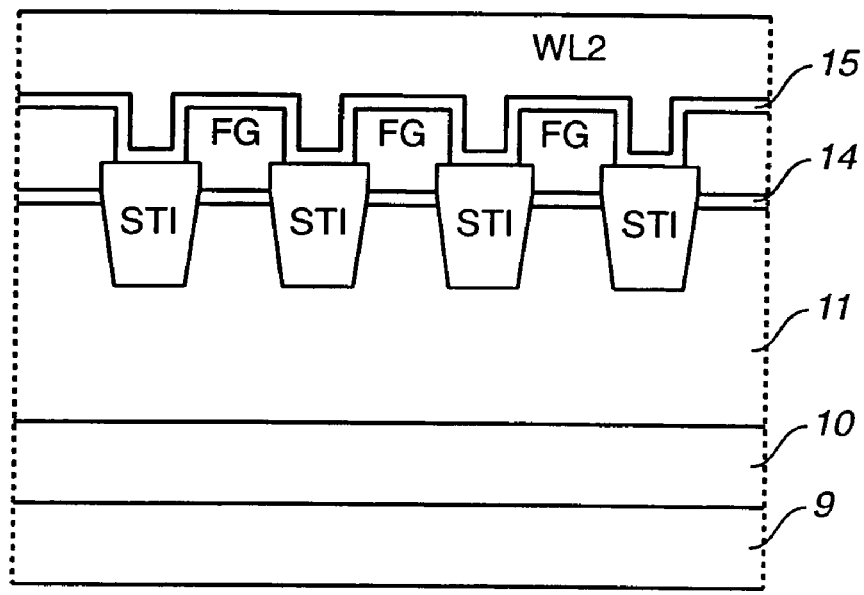
FIG._4
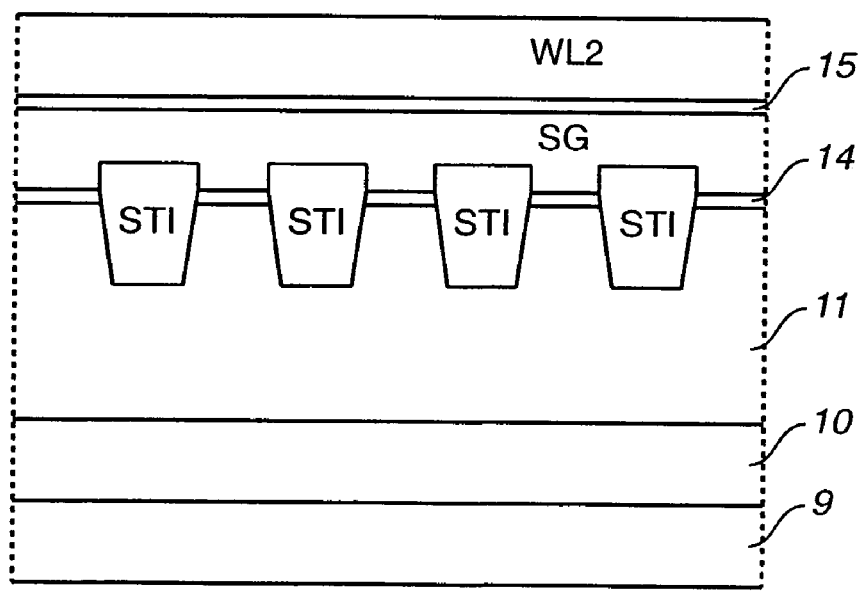
FIG._5

| | Erase | Program Promotion | Program Inhibition | Read10 | Read10 for 1st Pass | Read10 for 2nd Pass | Read00 | Read00 for 2nd Pass | Read01 | Verify10 for 1st Pass | Verify10 for 2nd Pass | Verify00 for 1st Pass | Verify00 for 2nd Pass | Verify01 |
|---|---|---|---|---|---|---|---|---|---|---|---|---|---|---|
| BLe | Floating | 0V | Vdd | H or L | H or L | H or L | H or L | H or L | H or L | H or L | H or L | H or L | H or L | H or L |
| BLo | Floating | Vdd | Vdd | 0V | 0V | 0V | 0V | 0V | 0V | 0V | 0V | 0V | 0V | 0V |
| SGD | Floating | Vdd | Vdd | 4.5V | 4.5V | 4.5V | 4.5V | 4.5V | 4.5V | 4.5V | 4.5V | 4.5V | 4.5V | 4.5V |
| WL3 | 0V | 10V | 10V | 4.5V | 4.5V | 4.5V | 4.5V | 4.5V | 4.5V | 4.5V | 4.5V | 4.5V | 4.5V | 4.5V |
| WL2 | 0V | Vpgm | Vpgm | 0V | 0V | 0V | 1V | 1V | 2V | 0.2V | 0.4V | 1.2V | 1.4V | 2.4V |
| WL1 | 0V | 10V | 10V | 4.5V | 4.5V | 4.5V | 4.5V | 4.5V | 4.5V | 4.5V | 4.5V | 4.5V | 4.5V | 4.5V |
| WL0 | 0V | 10V | 10V | 4.5V | 4.5V | 4.5V | 4.5V | 4.5V | 4.5V | 4.5V | 4.5V | 4.5V | 4.5V | 4.5V |
| SGS | Floating | 0V | 0V | 0V | 0V | 0V | 0V | 0V | 0V | 0V | 0V | 0V | 0V | 0V |
| C-source | Floating | 0V | 0V | 0V | 0V | 0V | 0V | 0V | 0V | 0V | 0V | 0V | 0V | 0V |
| C-p-well | 20V | 0V | 0V | 0V | 0V | 0V | 0V | 0V | 0V | 0V | 0V | 0V | 0V | 0V |

FIG._6

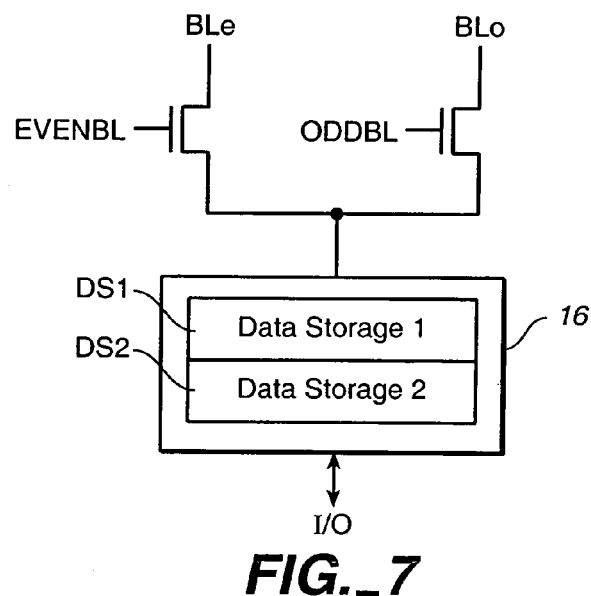
FIG._7
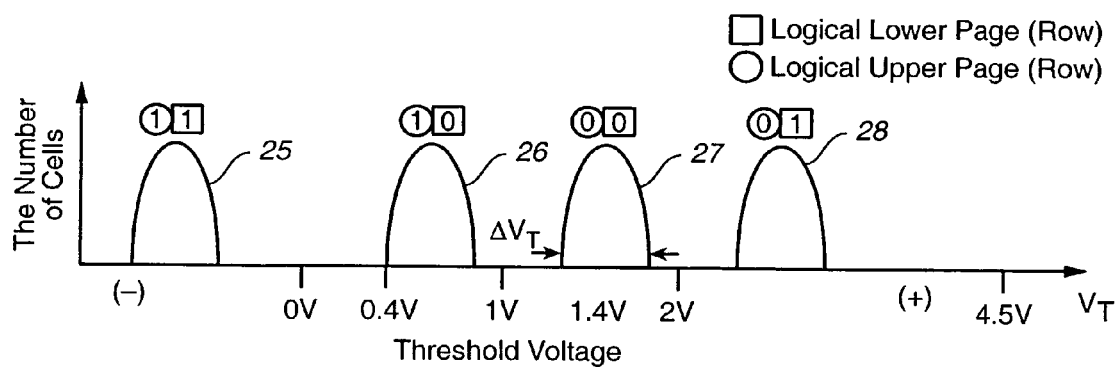
FIG._8

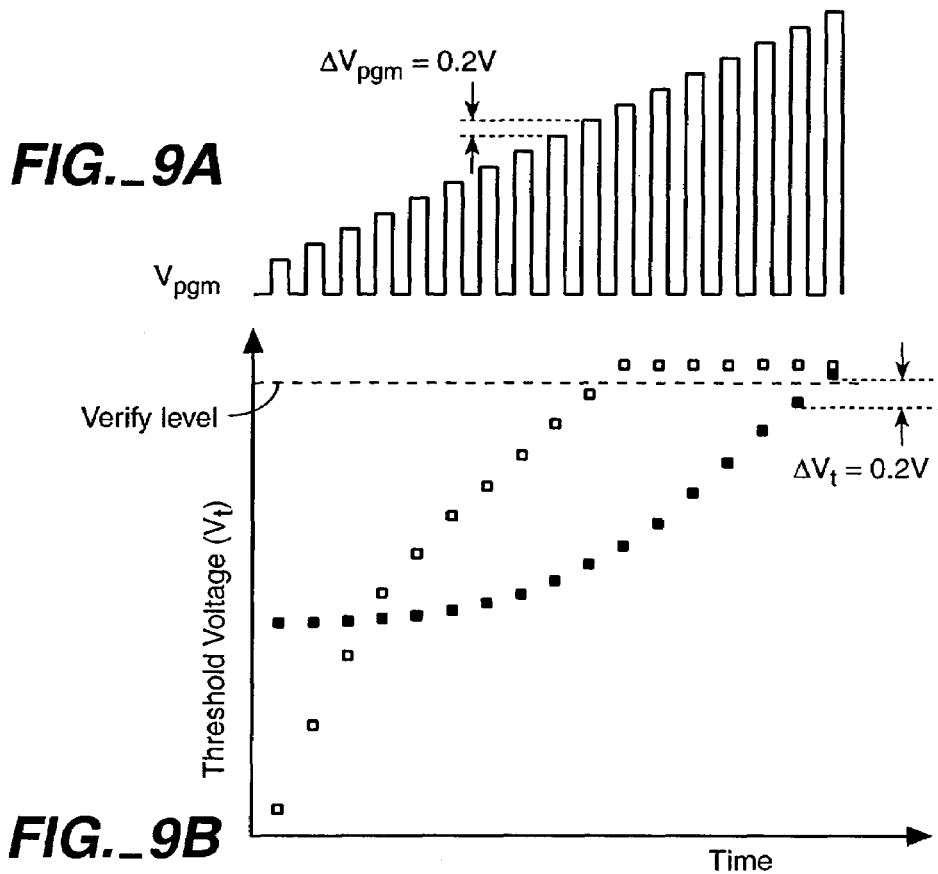
FIG._9A
FIG._9B
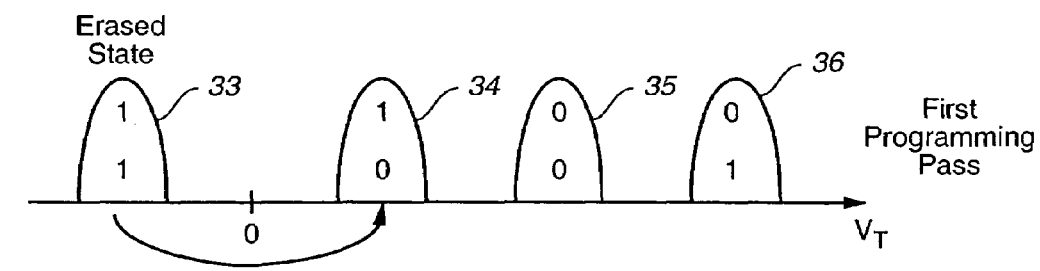
FIG._10A
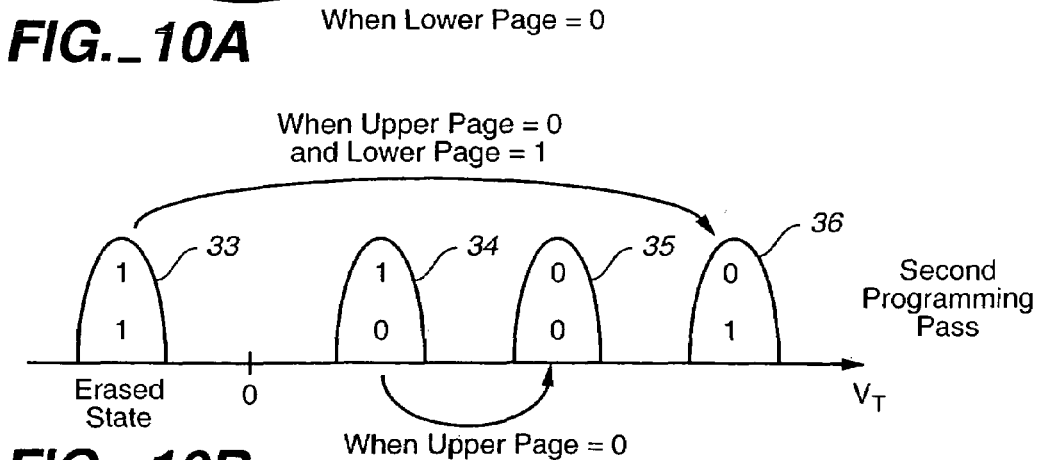
FIG._10B

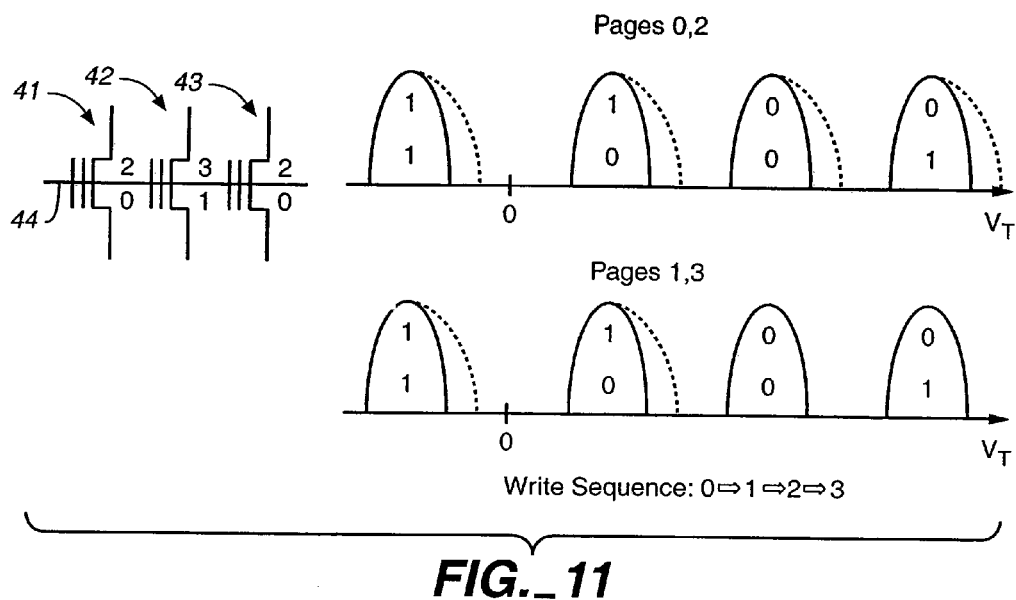
FIG._11
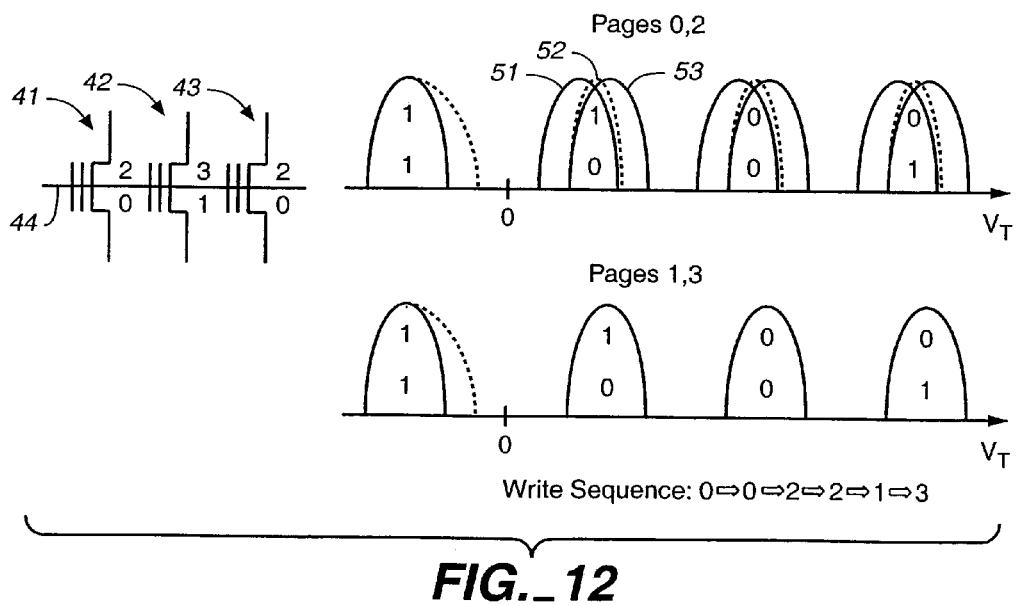
FIG._12

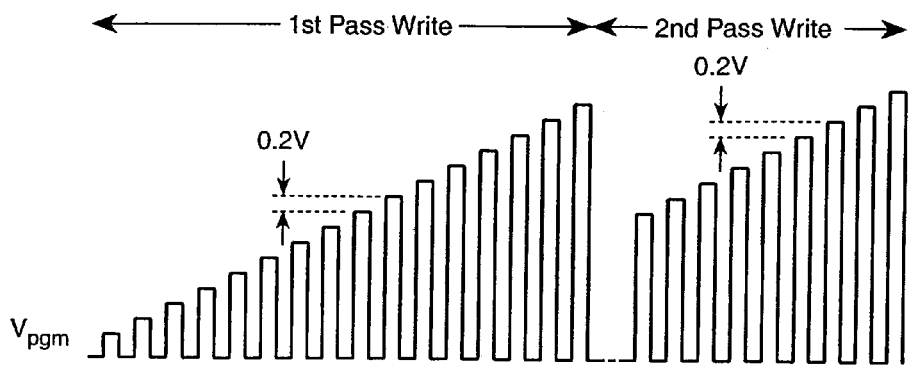
FIG._14A
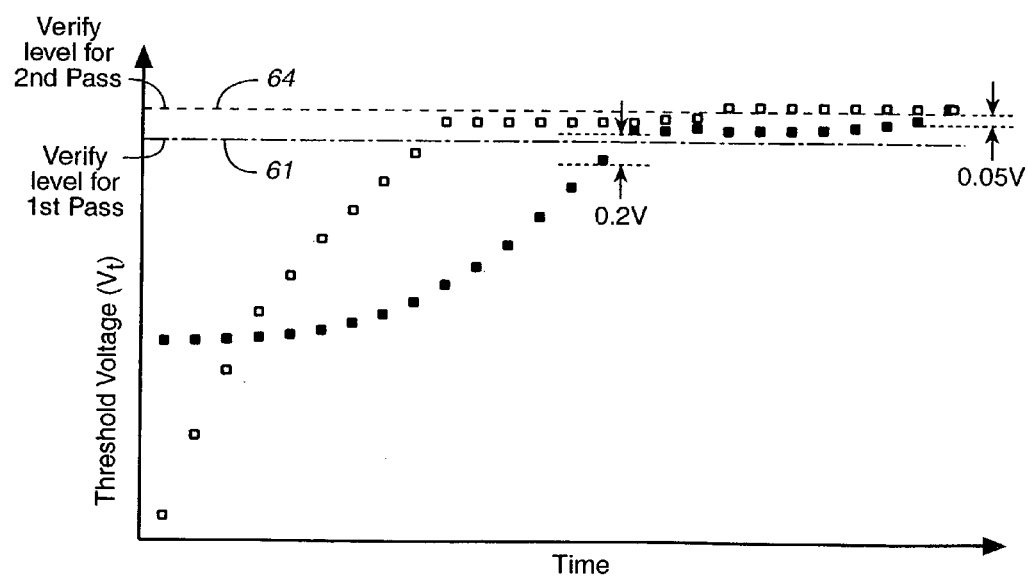
FIG._14B

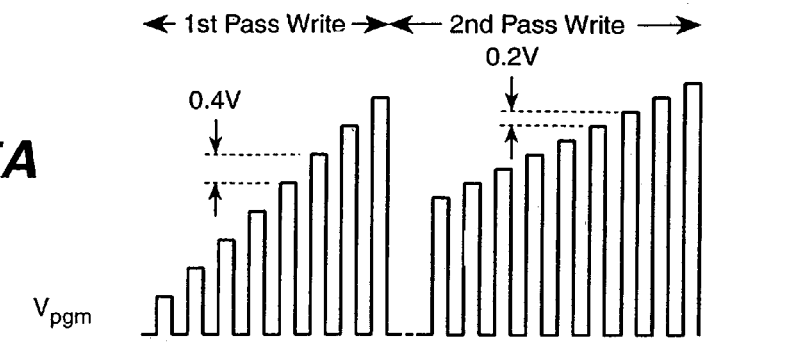
FIG._15A
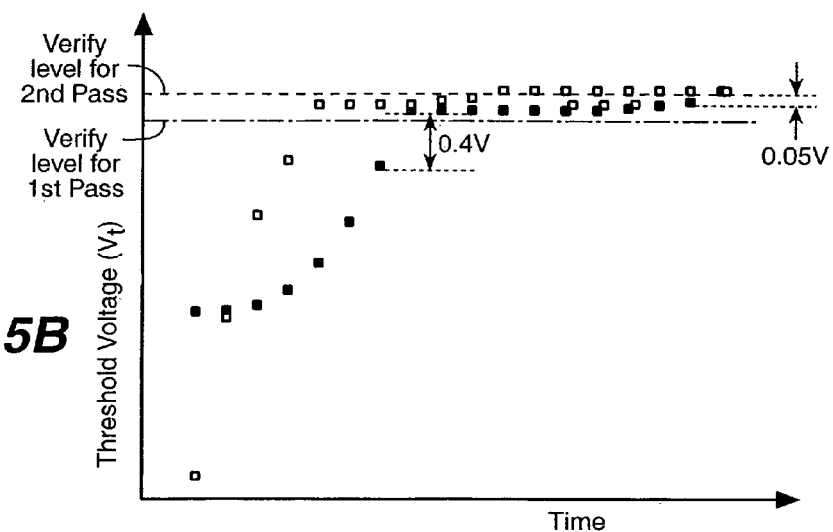
FIG._15B
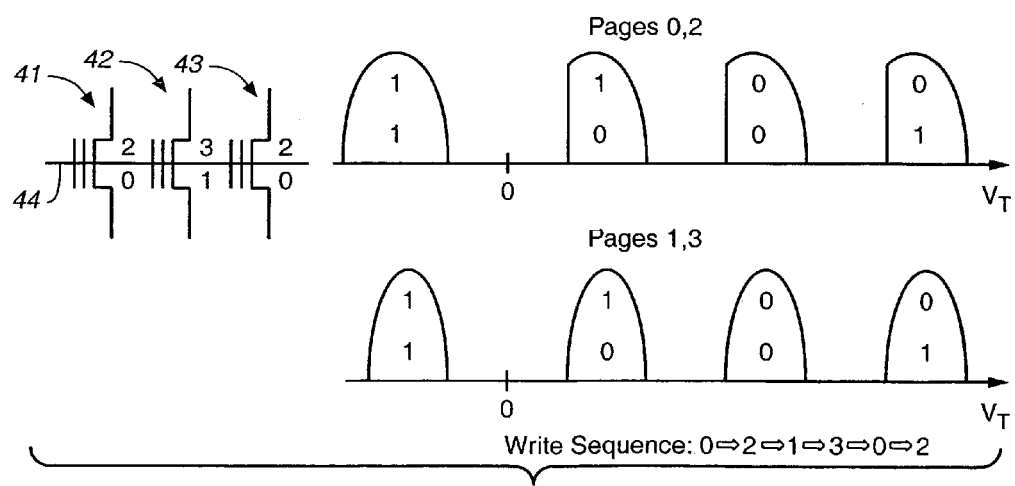
FIG._16

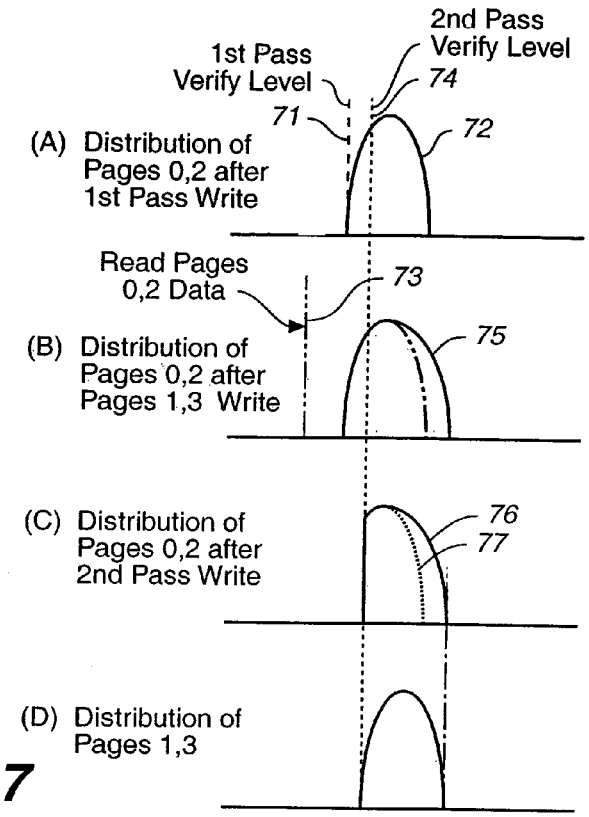
FIG._17
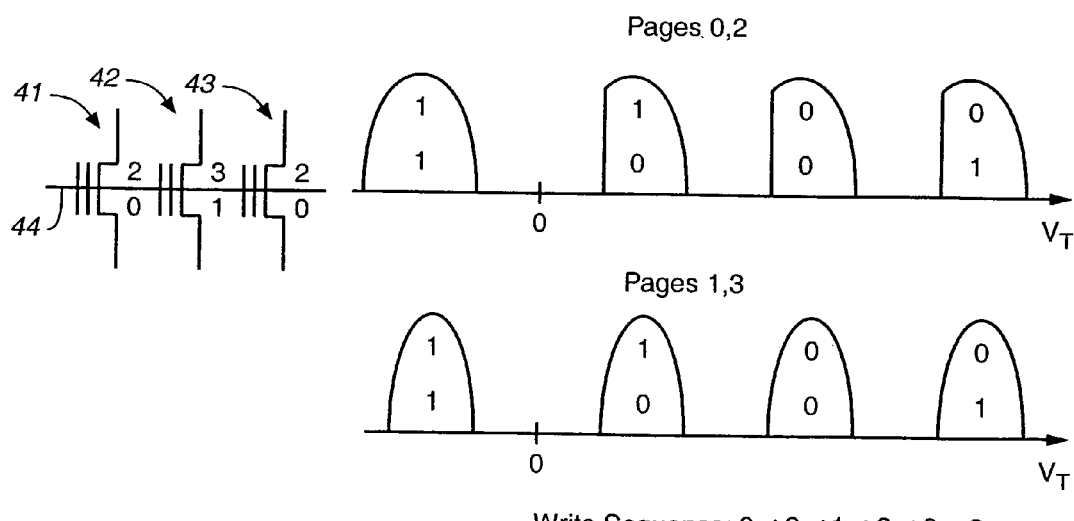
FIG._18

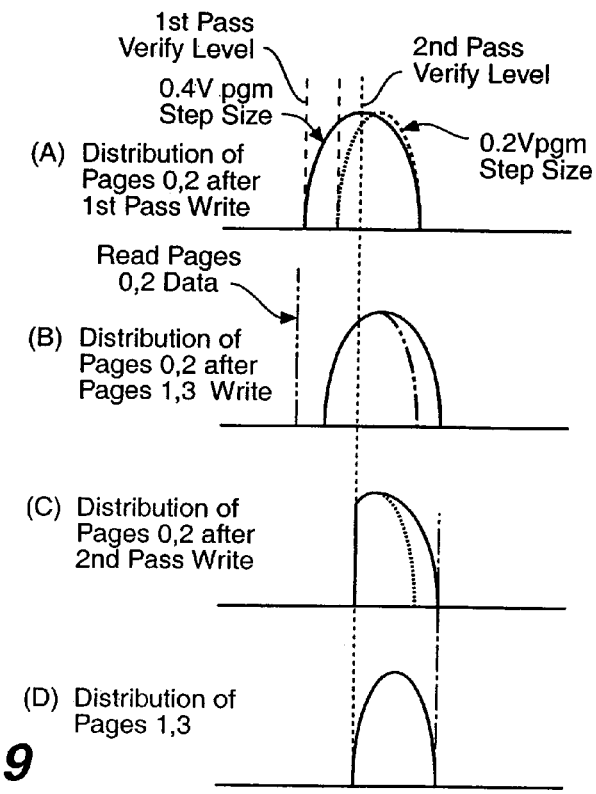
FIG._19
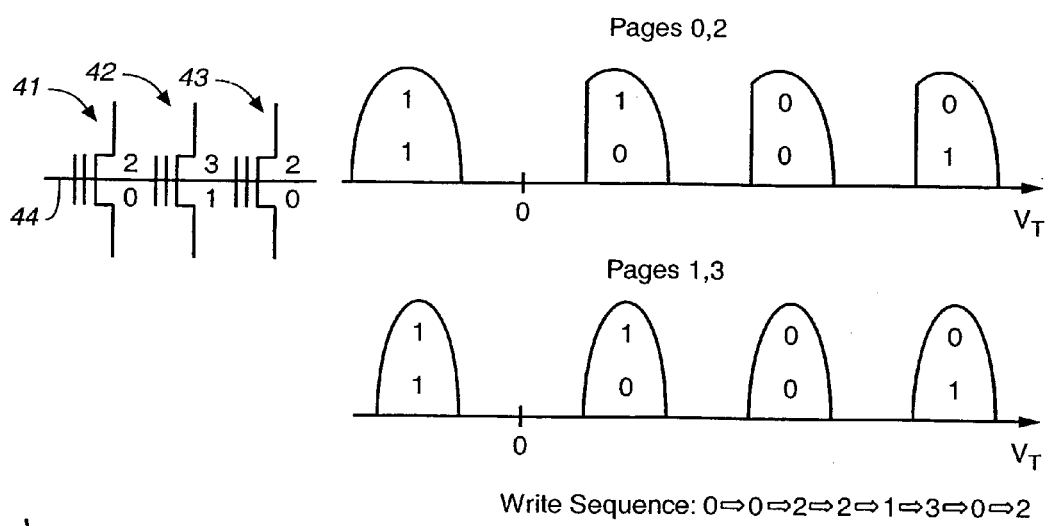
FIG._20

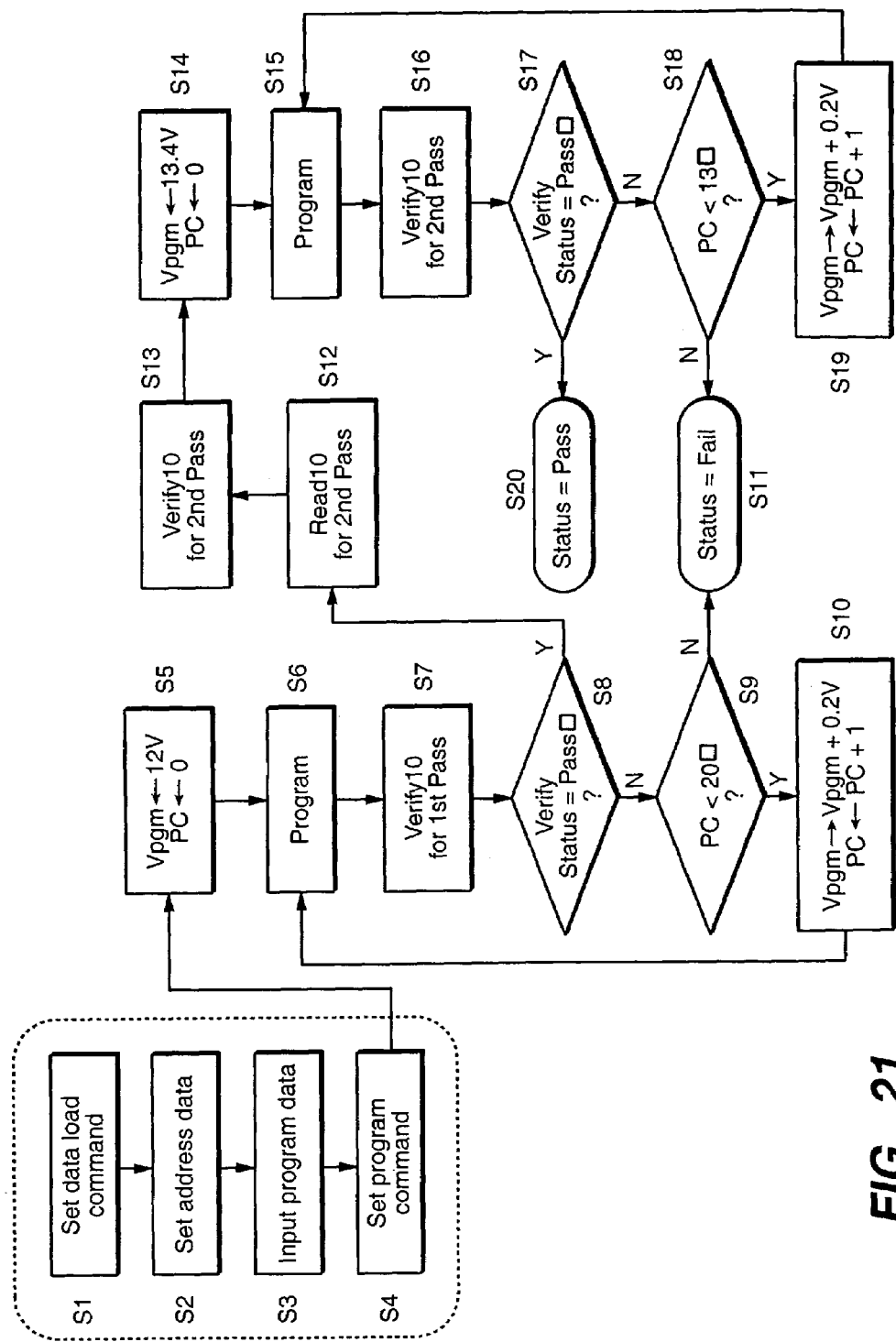
FIG._21

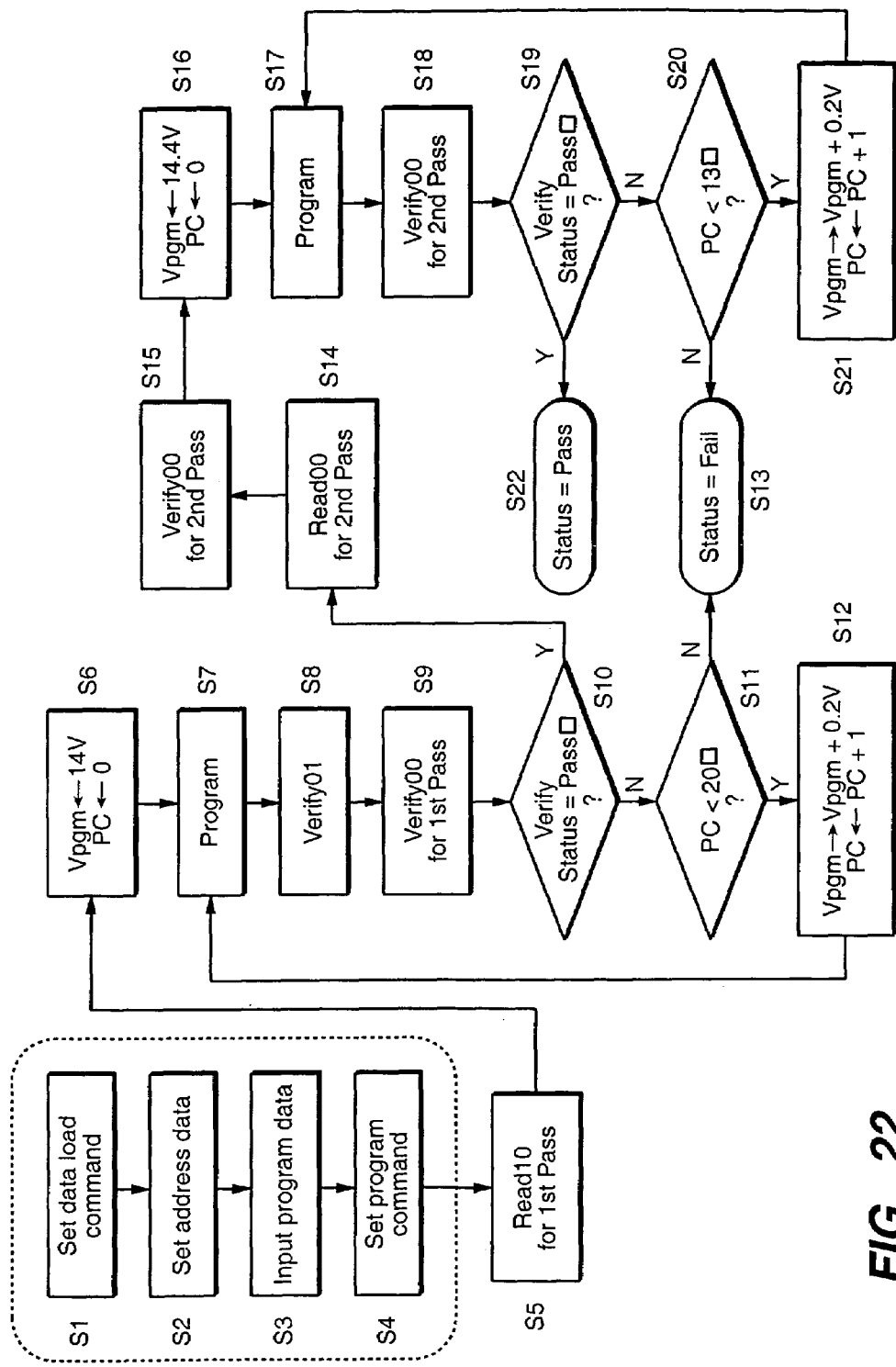
FIG._22

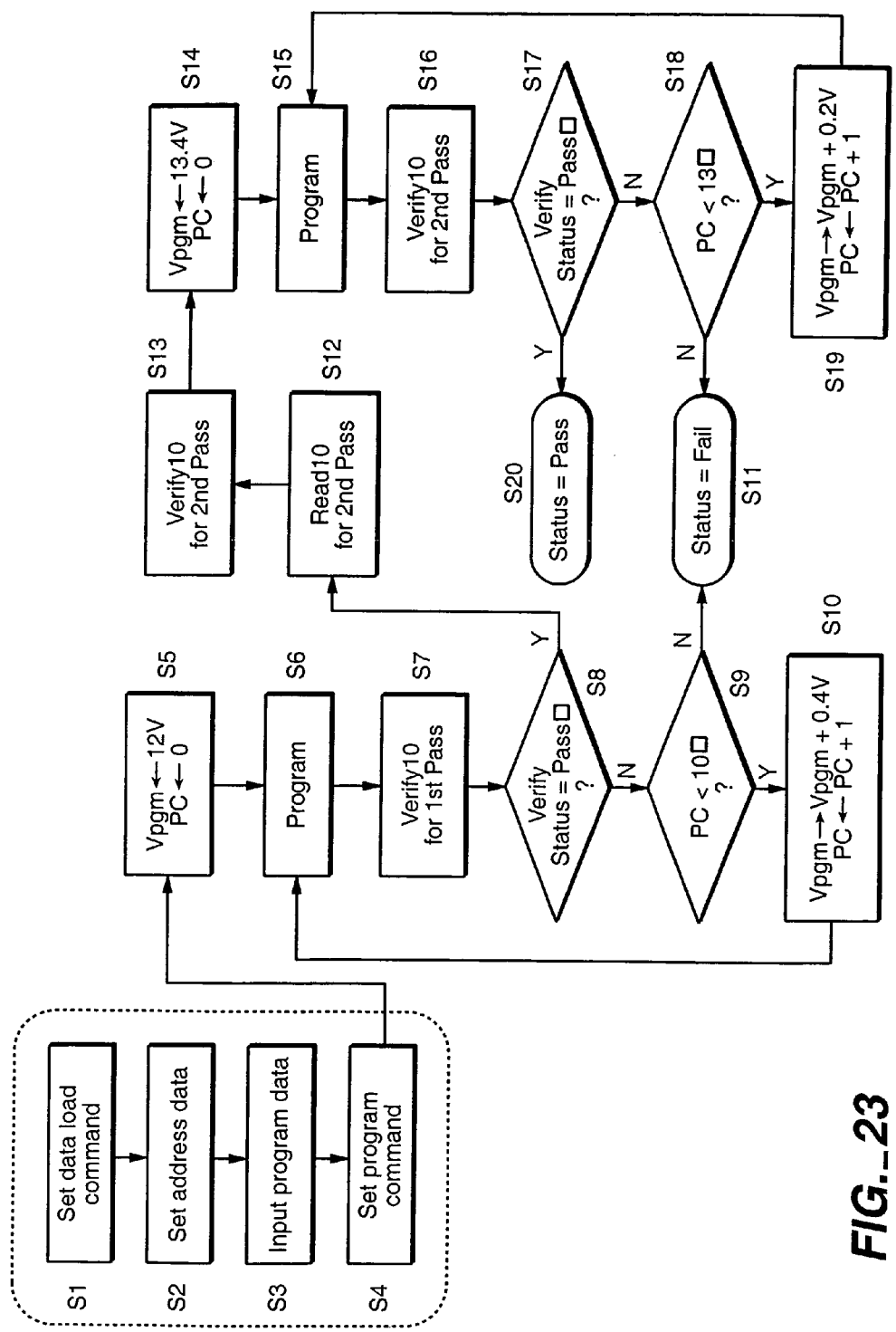
FIG._23

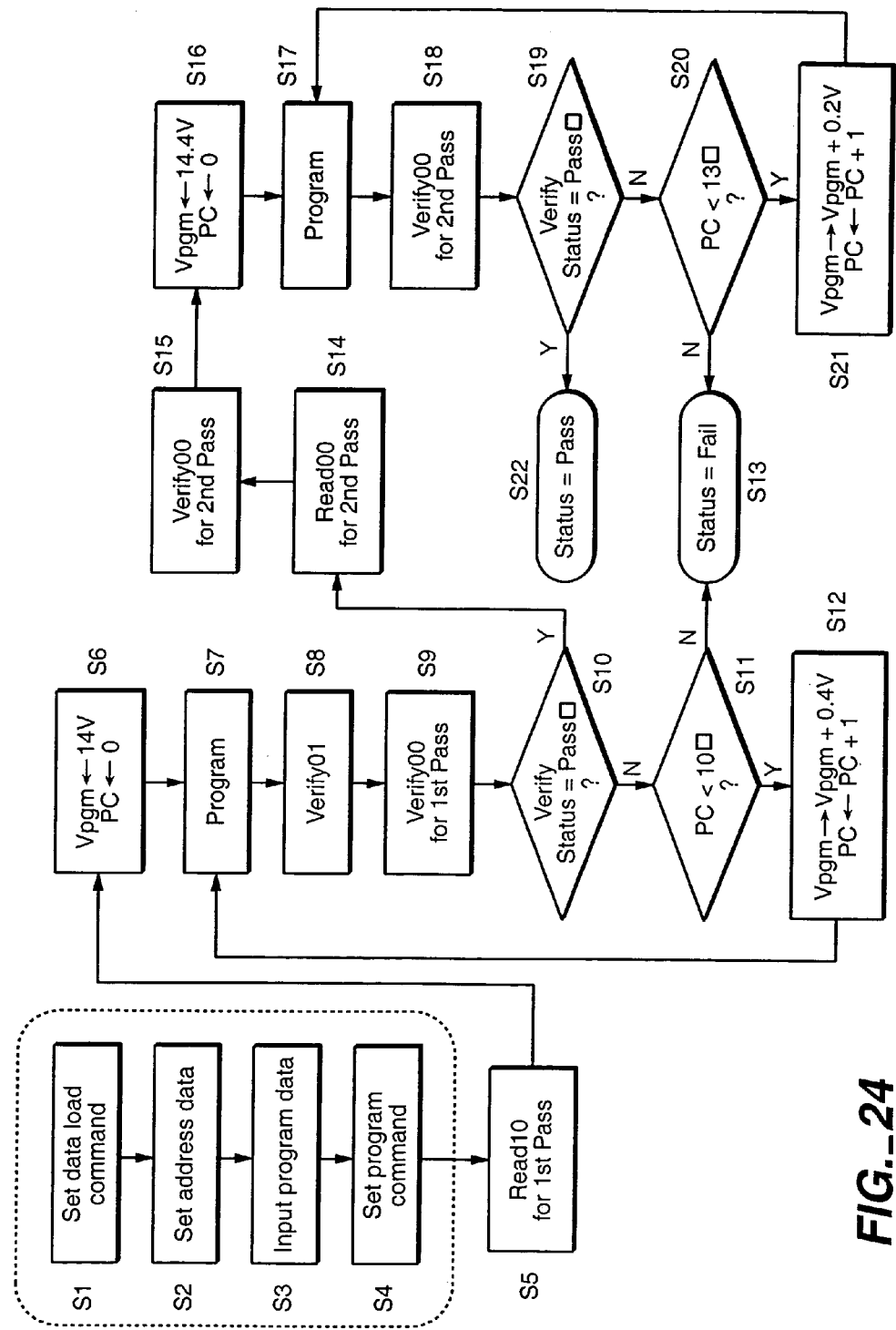
FIG._24

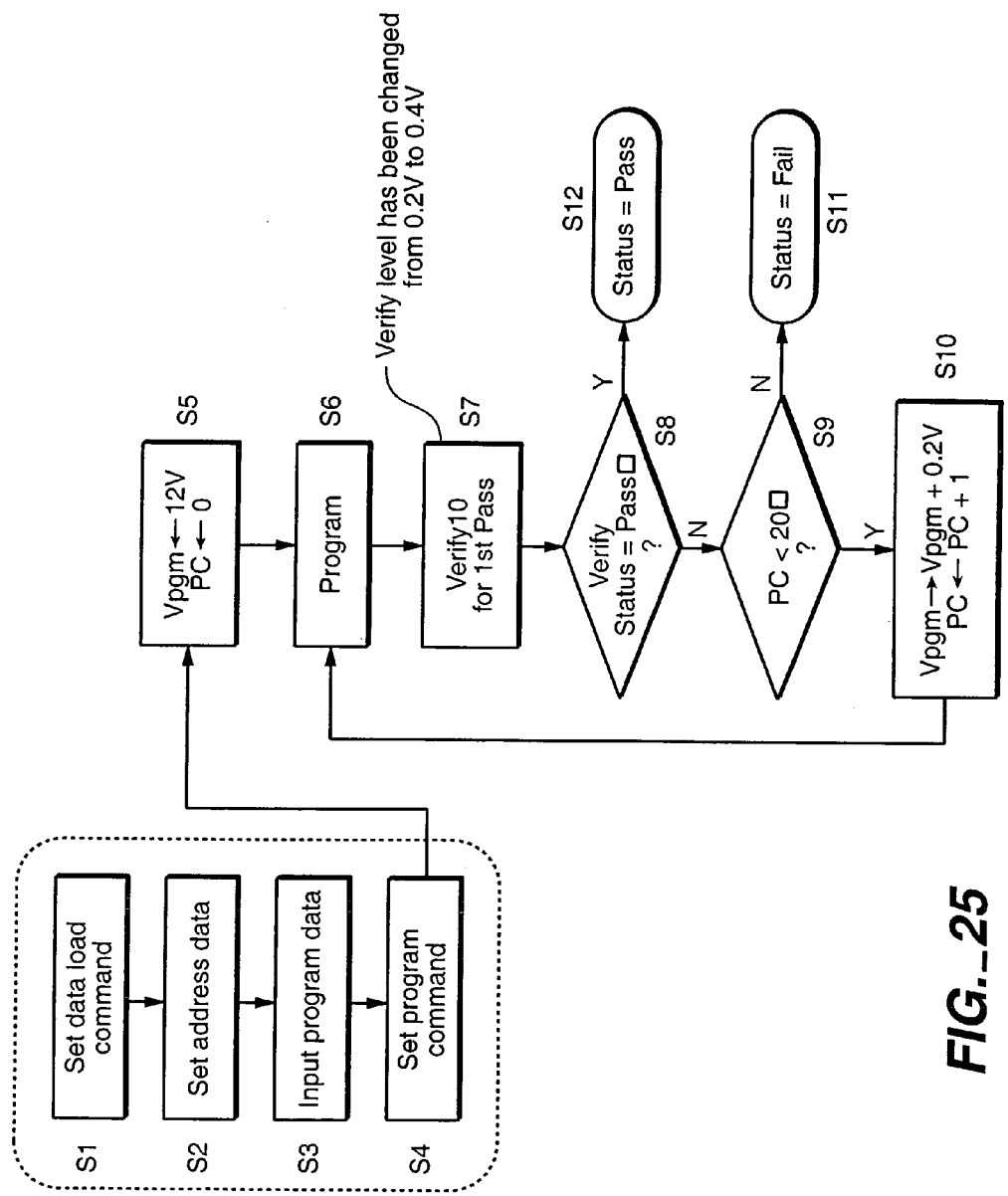
FIG._25

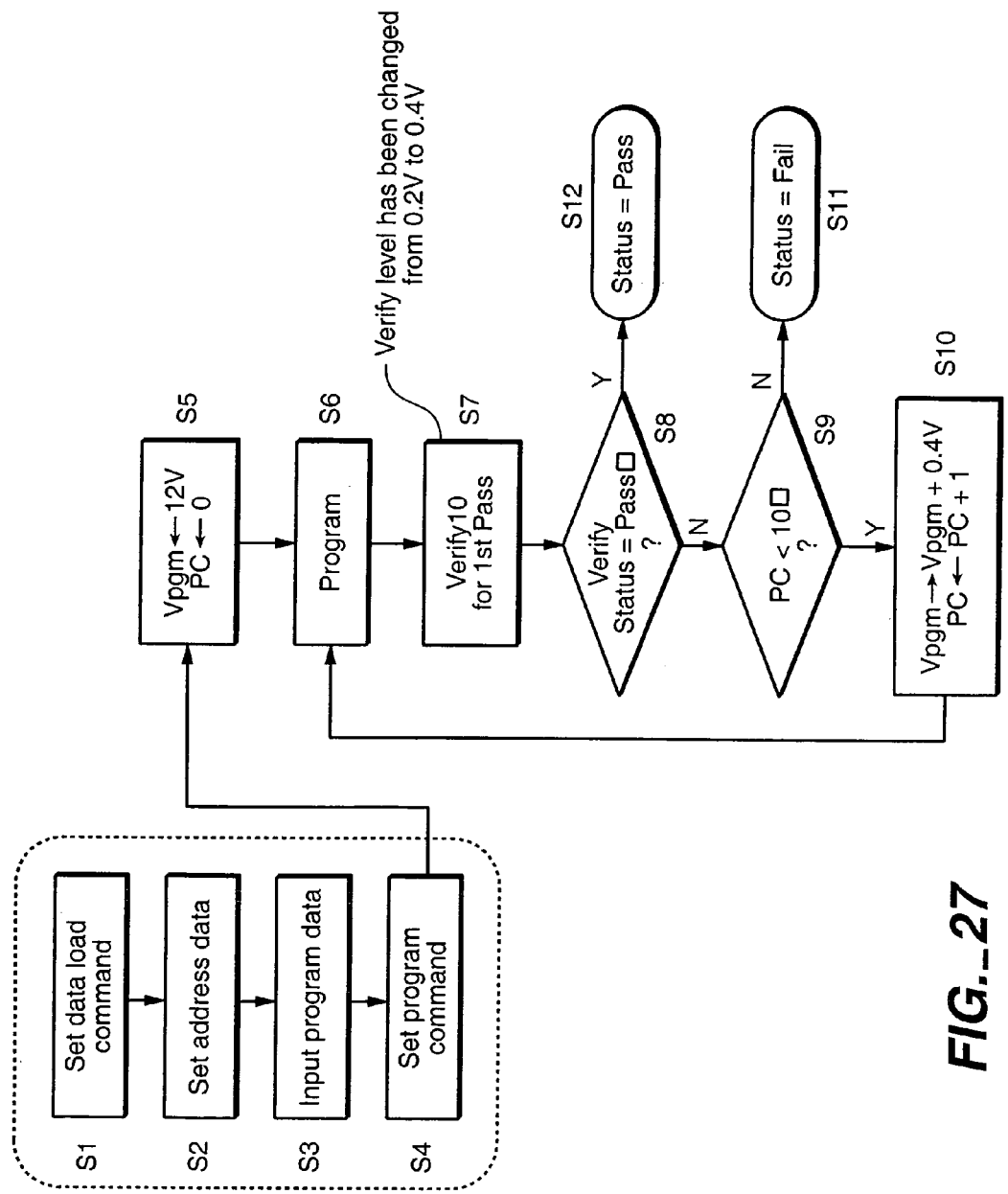
FIG._27

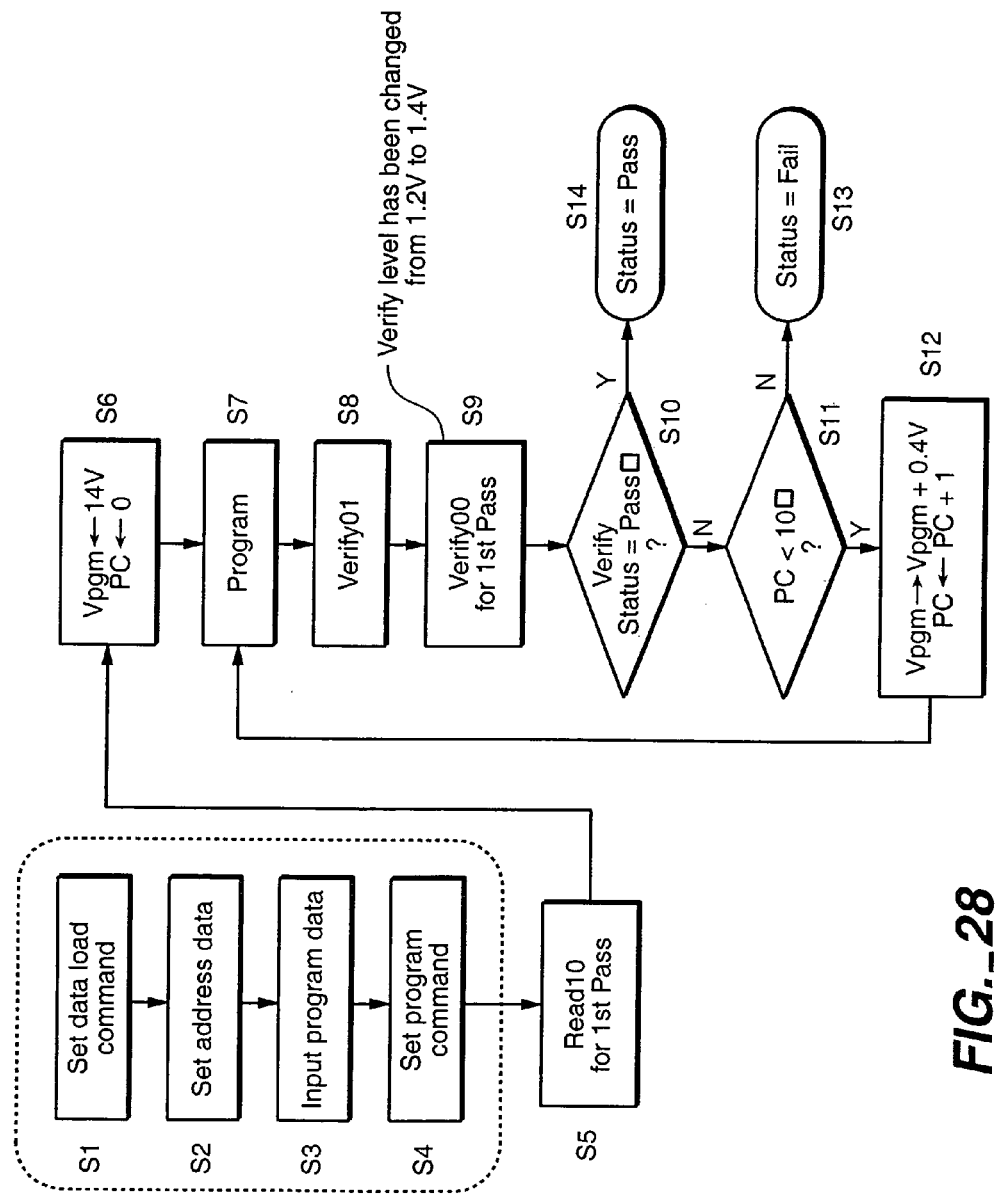
FIG._28

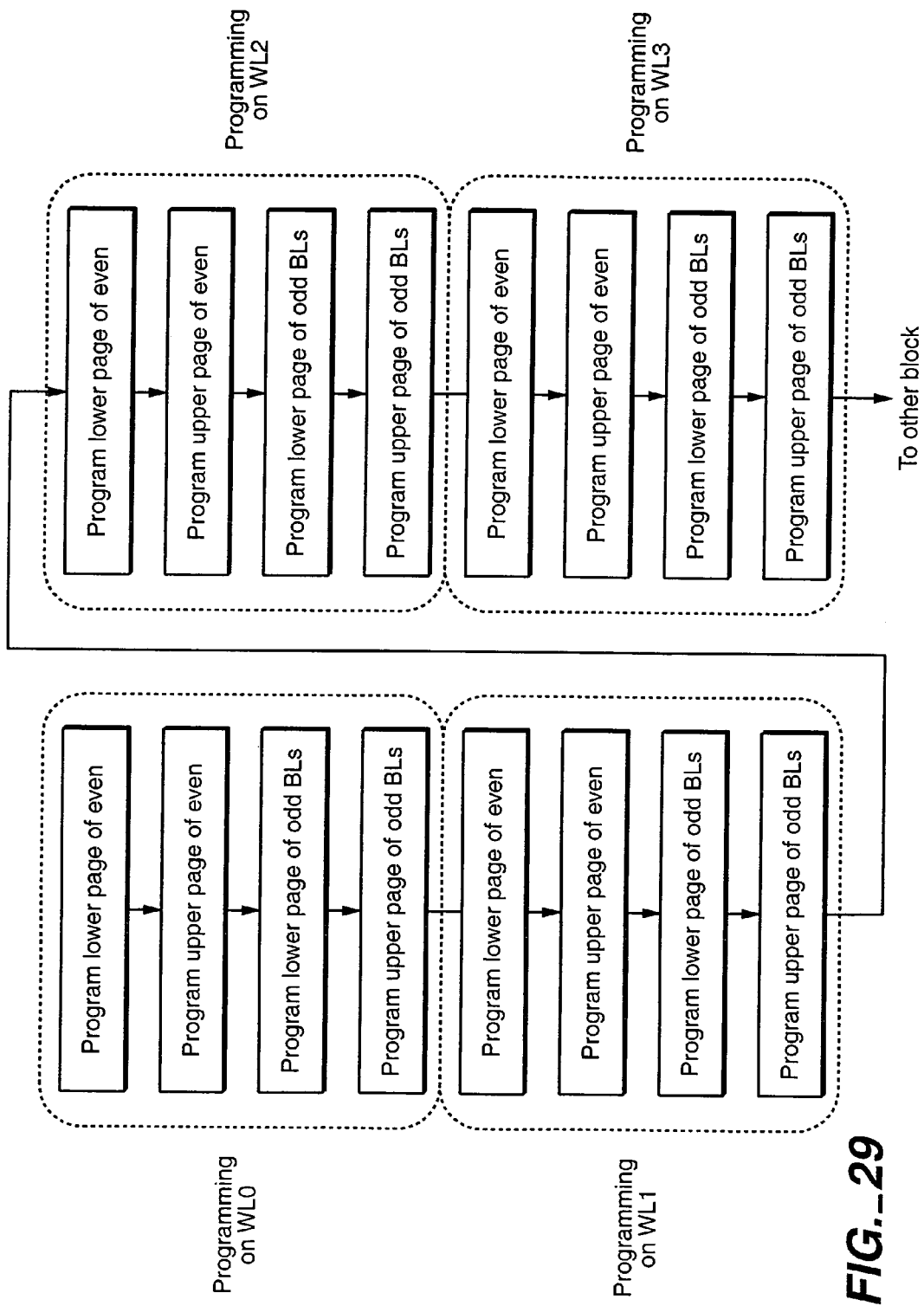
FIG._29

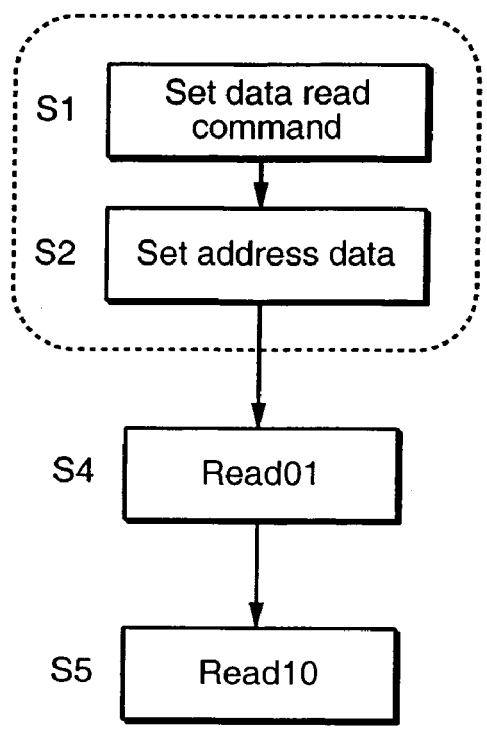
FIG._30
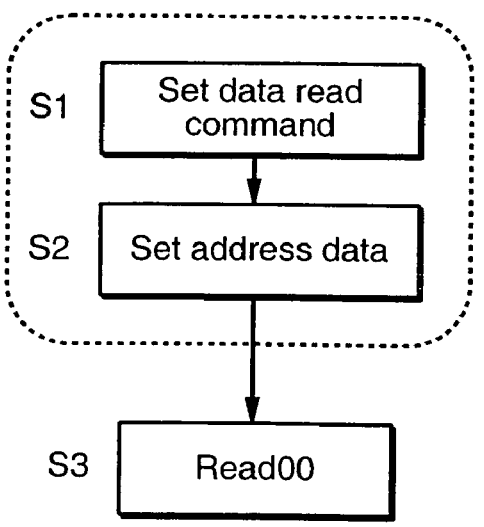
FIG._31

OPERATING TECHNIQUES FOR REDUCING EFFECTS OF COUPLING BETWEEN STORAGE ELEMENTS OF A NON-VOLATILE MEMORY OPERATED IN MULTIPLE DATA STATES

CROSS-REFERENCE TO RELATED APPLICATIONS

This application is a continuation of application Ser. No. 10/323,534, filed Dec. 18, 2002, now U.S. Pat. No. 6,807, 095, which in turn is a continuation of application Ser. No. 09/893,277, filed Jun. 27, 2001, now U.S. Pat. No. 6,522, 580, which applications are incorporated herein in their entirety by this reference.

FIELD OF THE INVENTION

This invention relates generally to a non-volatile memory and its operation, and, more specifically, to techniques for reducing the effects of data stored in one memory storage element upon data read from other storage elements.

BACKGROUND OF THE INVENTION

The principles of the present invention have application to various types of non-volatile memories, those currently existing and those contemplated to use new technology being developed. Implementations of the present invention, however, are described with respect to a flash electrically-erasable and programmable read-only memory (EEPROM), wherein the storage elements are floating gates.

Field effect coupling between adjacent floating gates is described in U.S. Pat. No. 5,867,429 of Jian Chen and Yupin Fong, which patent is incorporated herein in its entirety by this reference. The degree of this coupling is necessarily increasing as the sizes of memory cell arrays are being decreased as the result of improvements of integrated circuit manufacturing techniques. The problem occurs most pronouncedly between two sets of adjacent cells that have been programmed at different times. One set of cells is programmed to add a level of charge to their floating gates that corresponds to one set of data. After the second set of cells is programmed with a second set of data, the charge levels read from the floating gates of the first set of cells often appears to be different than programmed because of the effect of the charge on the second set of floating gates being coupled with the first. This is known as the Yupin effect. Aforementioned U.S. Pat. No. 5,867,429 suggests either physically isolating the two sets of floating gates from each other, or taking into account the effect of the charge on the second set of floating gates when reading that of the first.

This effect is present in various types of flash BEPROM cell arrays. A NOR array of one design has its memory cells connected between adjacent bit (column) lines and control gates connected to word (row) lines. The individual cells contain either one floating gate transistor, with or without a select transistor formed in series with it, or two floating gate transistors separated by a single select transistor. Examples of such arrays and their use in storage systems are given in the following U.S. patents and pending applications of SanDisk Corporation that are incorporated herein in their entirety by this reference: U.S. Pat. Nos. 5,095,344, 5,172, 338, 5,602,987, 5,663,901, 5,430,859, 5,657,332, 5,712,180, 5,890,192, and 6,151,248, and Ser. Nos. 09/505,555, filed Feb. 17, 2000, now U.S. Pat. Nos. 6,426,893 and 09/667, 344, filed Sep. 22, 2000. now U.S. Pat. No. 6,512,263.

A NAND array of one design has a number of memory cells, such as 8, 16 or even 32, connected in series string between a bit line and a reference potential through select transistors at either end. Word lines are connected with control gates of cells in different series strings. Relevant examples of such arrays and their operation are given in the following U.S. patents and pending application of Toshiba that are incorporated herein in their entirety by this reference: U.S. Pat. Nos. 5,570,315, 5,774,397 and 6,046,935, and Ser. No. 09/667,610.

It is still most common in current commercial products for each floating gate to store a single bit of data by operating in a binary mode, where only two ranges of threshold levels of the floating gate transistors are defined as storage levels. The threshold levels of a floating gate transistor correspond to ranges of charge levels stored on their floating gates. In addition to shrinking the size of the memory arrays, the trend is to further increase the density of data storage of such memory arrays by storing more than one bit of data in each floating gate transistor. This is accomplished by defining more than two threshold levels as storage states for each floating gate transistor, four such states (2 bits of data per floating gate) now being included in commercial products. More storage states, such as 16 states per storage element, are contemplated. Each floating gate transistor has a certain total range (window) of threshold voltages in which it may practically be operated, and that range is divided into the number of states defined for it plus margins between the states to allow for them to be clearly differentiated from one another.

A common operation of these types of non-volatile memories is to erase blocks of memory cells prior to reprogramming them. The cells within the block are then individually programmed out of erase into states represented by the incoming data being stored. Programming typically includes alternate application to a large number of memory cells in parallel of programming voltage pulses and a reading of their individual states to determine whether the individual cells have reached their intended levels. Programming is stopped for any cell that is verified to have reached its intended threshold level while programming of the other cells being programmed in parallel continues until all of those cells are programmed. When the number of storage states per storage element is increased, the time to perform the programming will usually be increased since the smaller voltage ranges for the individual states requires a greater precision of programming. This can have a significant adverse impact on the performance of the memory system.

The narrower ranges of the defined floating gate storage levels that result from multi-state operation increases the level of sensitivity of a first group of storage elements to the amount of charge stored on a later programmed second group of adjacent storage elements. When the first group is being read, for example, the charge on the second group can lead to errors in reading the states of the first group. The field coupled from the adjacent memory elements can shift the apparent state being read a sufficient amount to lead to an erroneous read of at least some bits of a group of stored data. If the number of erroneous bits is maintained within the capability of an error correction code (ECC), the errors are corrected but if the number of errors is typically larger than that, some other structural and/or operating technique(s) needs to be employed. The techniques described in aforementioned U.S. Pat. No. 5,867,429 are suitable for many arrays but it is desired to provide additional techniques to compensate for the operational effect of field coupling between adjacent floating gates.

SUMMARY OF THE INVENTION

Therefore, according to one primary aspect of the present invention, a first group of memory storage elements are reprogrammed to their desired states after a second adjacent group of storage elements has been programmed. Since periodically reading the state of the cells is part of the programming process in order to know when to stop, the reprogramming places any additional charge on the first group of storage elements that is necessary to compensate for the effect of the field coupling with the later programmed adjacent storage elements. An alternating pulse and reading sequence of a typical programming operation may be used to reprogram the first group of storage elements in the presence of the effect of the second adjacent programmed group of storage elements. A later reading of the first group of cells, even though still influenced by the charge on adjacent cells, is now more accurate since the effect of the charge on the adjacent cells has been taken into account as a result of the reprogramming. In order to avoid having to maintain a data buffer that is large enough to hold the data programmed in the first pass for later use in the second programming pass, the data stored by the first pass may be read from the memory with adjusted read margins and then that data is reprogrammed in the second pass.

According to another primary aspect of the present invention, a distribution of programming levels among storage elements programmed to the same state is compacted by reprogramming some of the storage elements on one side of the distribution into the other side of the distribution. The storage elements of a given state are all read and those having programmed levels below a defined threshold within the distribution are given additional programming to raise their levels above the defined threshold. This has the effect of reducing the amount of the programming window that is required for each of the states of the memory, thus allowing additional states to be included and/or additional space to be provided between states. Such compacting can be performed independently of the aspect described in the preceding paragraph but may also advantageously be included as part of the reprogramming steps. Indeed, the second programming pass may occur immediately after the first programming of the same group of cells in order to narrow the programmed level distributions to an extent that takes into account the apparent spreading of these distributions that occurs after programming of adjacent cells. The step increase of programming pulse voltage levels may be made higher than usual for the first programming pass, in order to quickly program a group of cells to their initial levels within broad distributions, and then the usual small incremental voltage increase of programming pulses during the second pass in order to compact the spread of those distributions. These techniques result in improved performance by allowing the narrow voltage threshold distributions of the programmed memory cells to be reached quickly.

According to another primary aspect of the present invention, the order in which adjacent memory cells are programmed according to an existing multi-state programming technique is accomplished in a manner that minimizes the Yupin effect of cross-coupling between such adjacent cells. According to the existing programming technique, a first group of alternate adjacent cells in a row or column is partially programmed in a first programming step to the levels of a first data bit, a remaining second group of alternate cells is then similarly partially programmed to the levels of a first data bit for those cells, followed by completing the programming of the first group with a second bit of data per cell, and, finally, the programming of the second group is then completed with its second bit. But in order to minimize the Yupin effect among the storage elements of such cells, according to a third primary aspect of the present invention, both bits are programmed in separate steps into the first group of cells, followed by programming the second group of cells with its two bits of data in separate steps. This technique is particularly applicable, but not limited to, use during programming a NAND memory. This technique may be used by itself, or with the techniques of the first and/or second primary aspects of the present invention that are summarized above, to counteract, in various degrees, the Yupin effect of coupling between adjacent storage elements.

Additional aspects, features and advantages of the present invention are included in the following description of exemplary embodiments, which description should be taken in conjunction with the accompanying drawings.

BRIEF DESCRIPTION OF THE DRAWINGS

FIG. 1 is a block diagram of a non-volatile memory system in which the various aspects of the present invention are described to be implemented;

FIG. 2 illustrates an existing circuit and organization of the memory array of FIG. 1 when a NAND type;

FIG. 3 shows a cross-sectional view, along a column, of a NAND type of memory array formed on a semiconductor substrate;

FIG. 4 is a cross-sectional view of the memory array of FIG. 3, taken at section 4—4 thereof;

FIG. 5 is a cross-sectional view of the memory array of FIG. 3, taken at section 5—5 thereof;

FIG. 6 provides Table 1 of example operating voltages of the NAND memory cell array of FIGS. 2–5;

FIG. 7 illustrates another feature of the NAND memory cell array of FIGS. 2–5;

FIG. 8 shows an example existing distribution of threshold voltages of the NAND memory cell array of FIGS. 2–5 when operated in four states;

FIG. 9B shows existing voltage threshold responses of the memory cell array of FIGS. 2–5 in response to being programmed with voltage pulses of FIG. 9A;

FIGS. 10A and 10B are voltage threshold level distributions that illustrate an existing technique for programming the memory cell array of FIGS. 2–5;

FIG. 11 shows the Yupin effect on threshold distributions of the memory cell array of FIGS. 2–5 when programmed with an existing technique;

FIG. 12 shows the Yupin effect on threshold distributions of the memory cell array of FIGS. 2–5 when programmed with a first technique illustrating the present invention;

FIG. 14B shows voltage threshold level responses of the memory cell array of FIGS. 2–5 to programming pulses of FIG. 14A according to the programming method of FIG. 13;

FIG. 15B shows voltage threshold level responses of the memory cell array of FIGS. 2–5 to an alternate set of programming pulses of FIG. 15A according to the programming method of FIG. 13;

FIG. 16 shows the Yupin effect on threshold distributions of the memory cell array of FIGS. 2–5 when programmed with a second technique illustrating the present invention;

FIG. 17 illustrates the steps of programming the memory cell array of FIGS. 2–5 according to the second technique whose results are shown in FIG. 16;

FIG. 18 shows the Yupin effect on threshold distributions of the memory cell array of FIGS. 2–5 when programmed with a variation of the second technique illustrating the present invention;

FIG. 19 illustrates the steps of programming the memory cell array of FIGS. 2–5 according to the variation of the second technique whose results are shown in FIG. 18;

FIG. 20 shows the Yupin effect on threshold distributions of the memory cell array of FIGS. 2–5 when programmed with a third technique illustrating the present invention;

FIG. 21 is a flow chart showing a first part of a first exemplary embodiment of a method of programming the memory cell array of FIGS. 2–5;

FIG. 22 is a flow chart showing a second part of the first exemplary embodiment of a method of programming the memory cell array of FIGS. 2–5;

FIG. 23 is a flow chart showing a first part of a second exemplary embodiment of a method of programming the memory cell array of FIGS. 2–5;

FIG. 24 is a flow chart showing a second part of the second exemplary embodiment of a method of programming the memory cell array of FIGS. 2–5;

FIG. 25 is a flow chart showing, when combined with FIG. 21, a first part of a third exemplary embodiment of a method of programming the memory cell array of FIGS. 2–5;

FIG. 27 is a flow chart showing, when combined with FIG. 23, a first part of a fourth exemplary embodiment of a method of programming the memory cell array of FIGS. 2–5;

FIG. 28 is a flow chart showing, when combined with FIG. 24, a second part of the fourth exemplary embodiment of a method of programming the memory cell array of FIGS. 2–5;

FIG. 29 illustrates a programming sequence utilizing the third and fourth embodiments;

FIG. 30 shows a first part of a method to read data from the memory of FIGS. 2–5; and FIG. 31 shows a second part of the method to read data from the memory of FIGS. 2–5.

DESCRIPTION OF EXEMPLARY EMBODIMENTS

Example Non-Volatile Memory System

Figure 13:
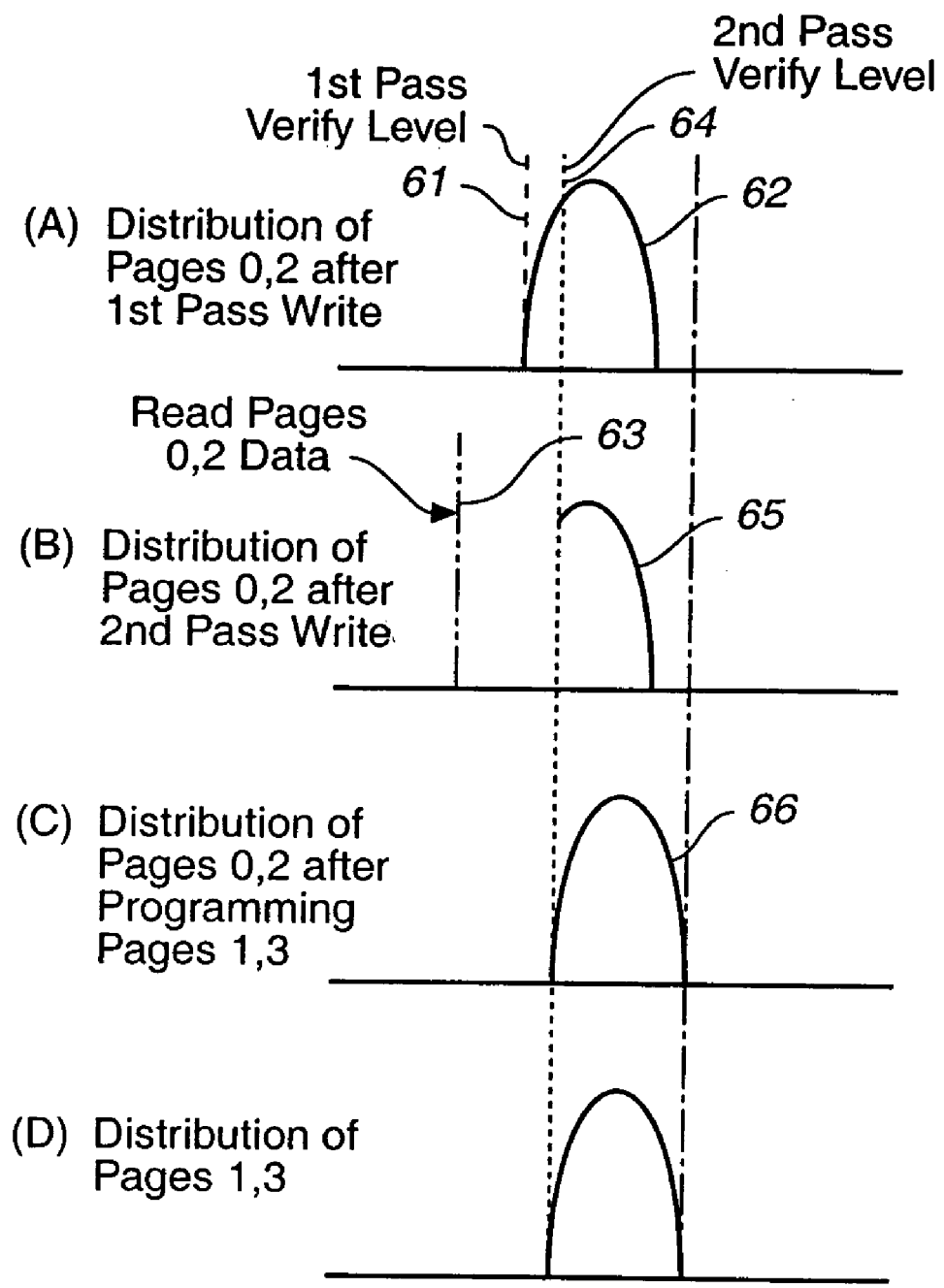
FIG. 13 illustrates the steps of programming the memory cell array of FIGS. 2–5 according to the first technique whose results are shown in FIG. 12.

With reference to FIGS. 1–7, a specific non-volatile memory system is described in which the various aspects of the present invention are implemented, in order to provide specific examples. FIG. 1 is a block diagram of a flash memory system. Memory cell array 1 including a plurality of memory cells M arranged in a matrix is controlled by a column control circuit 2, a row control circuit 3, a c-source control circuit 4 and a c-p-well control circuit 5. The column control circuit 2 is connected to bit lines (BL) of the memory cell array 1 for reading data stored in the memory cells (M), for determining a state of the memory cells (M) during a program operation, and for controlling potential levels of the bit lines (BL) to promote the programming or to inhibit the programming. The row control circuit 3 is connected to word lines (WL) to select one of the word lines (WL), to apply read voltages, to apply a program voltages combined with the bit line potential levels controlled by the column control circuit 2, and to apply an erase voltage coupled with a voltage of a p-type region (labeled as "c-p-well" 11 in FIG. 3) on which the memory cells (M) are formed. The c-source control circuit 4 controls a common source line (labeled as "c-source" in FIG. 2) connected to the memory cells (M). The c-p-well control circuit 5 controls the c-p-well voltage.

The data stored in the memory cells (M) are read out by the column control circuit 2 and are output to external I/O lines via an I/O line and a data input/output buffer 6. Program data to be stored in the memory cells are input to the data input/output buffer 6 via the external I/O lines, and transferred to the column control circuit 2. The external I/O lines are connected to a controller 20.

Command data for controlling the flash memory device are input to a command interface) connected to external control lines which are connected with the controller 20. The command data informs the flash memory of what operation is requested. The input command is transferred to a state machine 8 that controls the column control circuit 2, the row control circuit 3, the c-source control circuit 4, the c-p-well control circuit 5 and the data input/output buffer 6. The state machine 8 can output a status data of the flash memory such as READY/BUSY or PASS/FAIL.

The controller 20 is connected or connectable with a host system such as a personal computer, a digital camera, a personal digital assistant. It is the host which initiates commands, such as to store or read data to or from the memory array 1, and provides or receives such data, respectively. The controller converts such commands into command signals that can be interpreted and executed by the command circuits 7. The controller also typically contains buffer memory for the user data being written to or read from the memory array. A typical memory system includes one integrated circuit chip 21 that includes the controller 20, and one or more integrated circuit chips 22 that each contain a memory array and associated control, input/output and state machine circuits. The trend, of course, is to integrate the memory array and controller circuits of a system together on one or more integrated circuit chips. The memory system may be embedded as part of the host system, or may be included in a memory card that is removably insertable into a mating socket of host systems. Such a card may include the entire memory system, or the controller and memory array, with associated peripheral circuits, may be provided in separate cards.

With reference to FIG. 2, an example structure of the memory cell array 1 is described. A flash EEPROM of a NAND type is described as an example. The memory cells (M) are partitioned into 1,024 blocks, in a specific example. The data stored in each block are simultaneously erased. The block is thus the minimum unit of a number of cells that are simultaneously erasable. In each block, in this example, there are 8,512 columns that are divided into even columns and odd columns. The bit lines are also divided into even bit lines (BLe) and odd bit lines (BLo). Four memory cells connected to the word lines (WL0 to WL3) at each gate electrode are connected in series to form a NAND cell unit. One terminal of the NAND cell unit is connected to corresponding bit line (BL) via a first select transistor (S) which gate electrode is coupled to a first select gate line (SGD), and another terminal is connected to the c-source via a second select transistor (S) which gate electrode is coupled to a second select gate line (SGS). Although four floating gate transistors are shown to be included in each cell unit, for simplicity, a higher number of transistors, such as 8, 16 or even 32, are used.

During a user data read and programming operation, 4,256 cells (M) are simultaneously selected, in this example. The cells (M) selected have the same word line (WL), for example WL2, and the same kind of bit line (BL), for example the even bit lines BLe0 to BLe4255. Therefore, 532 bytes of data can be read or programmed simultaneously. This 532B data simultaneously read or programmed forms a "page" logically. Therefore, one block can store at least eight pages. When each memory cell (M) stores two bits of data, namely a multi-level cell, one block stores 16 pages in the case of two bit per cell storage. In this embodiment, the storage element of each of the memory cells, in this case the floating gate of each of the memory cells, stores two bits of user data.

FIG. 3 shows a cross sectional view of a NAND cell unit of the type shown schematically in FIG. 2, in the direction of the bit line (BL). At a surface of a p-type semiconductor substrate 9, a p-type region c-p-well 11 is formed, the c-p-well being enclosed by an n-type region 10 to electrically isolate the c-p-well from the p-type substrate. The n-type region 10 is connected to a c-p-well line made of a first metal M0 via a first contact hole (CB) and an n-type diffusion layer 12. The p-type region c-p-well 11 is also connected to the c-p-well line via the first contact hole (CB) and a p-type diffusion layer 13. The c-p-well line is connected to the c-p-well control circuit 5 (FIG. 1).

Each memory cell has a floating gate (FG) that stores an amount of electric charge corresponding to the data being stored in the cell, the word line (WL) forming the gate electrode, and drain and source electrodes made of the p-type diffusion layer 12. The floating gate (FG) is formed on the surface of the c-p-well via a tunnel oxide film (14). The word line (WL) is stacked on the floating gate (FG) via an insulator film (15). The source electrode is connected to the common source line (c-source) made of the first metal (M0) via the second select transistor (S) and the first contact hole (CB). The common source line is connected to the c-source control circuit (4). The drain electrode is connected to the bit line (BL) made of a second metal (M1) via the first select transistor (S), the first contact hole (CB), an intermediate wiring of the first metal (M0) and a second contact hole (V1). The bit line is connected to the column control circuit (2).

FIGS. 4 and 5 show cross sectional views of a memory cell (section 4—4 of FIG. 3) and a select transistor (section 5—5 of FIG. 3), respectively, in the direction of the word line (WL2). Each column is isolated from the neighbor columns by a trench formed in the substrate and filled with isolation material, known as a shallow trench isolation (STI). The floating gates (FG) are isolated from each other by the STI and insulator film 15 and word line (WL). These days, a space between the floating gates (FG) is going to less than 0.1 um, and a capacitive coupling between the floating gates has been increasing. Since the gate electrode (SG) of the select transistor (S) is formed in the same formation process steps as the floating gate (FG) and word line (WL), it shows a stacked gate structure. These two select gate lines (SG) are shunted at the end of lines.

Table I of FIG. 6 summarizes voltages applied to operate the memory cell array 1, in a specific example, each memory cell's floating gate storing two bits, having one of the states "11", "10", "01", "00". This table shows the case where the word line "WL2" and the bit lines of "BLe" are selected for reading and programming. By raising the c-p-well to an erase voltage of 20V and grounding the word lines (WL) of a selected block, the data of the selected block is erased. Since all of the word lines (WL) of the unselected blocks, bit lines (BL), select lines (SG) and c-source are put in a floating state, these are also raised to almost 20V due to a capacitive coupling with the c-p-well. Therefore, a strong electric field is applied to only the tunnel oxide films 14 (FIGS. 4 and 5) of the selected memory cells (M), and the data of the selected memory cells are erased as a tunnel current flows across the tunnel oxide film 14. The erased cell is, in this example, one of the four possible programmed states, namely "11".

In order to store electrons in the floating gate (FG) during a programming operation, the selected word line WL2 is connected to a program pulse Vpgm and the selected bit lines BLe are grounded. On the other hand, in order to inhibit the program on the memory cells (M) in which programming is not to take place, the corresponding bit lines BLe are connected to Vdd of a power supply, for example 3V, as well as the unselected bit lines BLo. The unselected word lines WL0, WL1 and WL3 are connected to 10V, the first select gate (SGD) is connected to Vdd, and the second select gate (SGS) is grounded. As a result, a channel potential of the memory cell (M) that is being programmed is set at 0V. The channel potential in the program inhibition is raised to around 6V as a result of the channel potential being pulled up by the capacitive coupling with the word lines (WL). As explained above, a strong electric field is applied to only the tunnel oxide films 14 of the memory cells (M) during programming, and the tunnel current flows across the tunnel oxide film 14 in the reverse direction compared to the erase, and then the logical state is changed from "11" to one of the other states "10", "01", or "00".

In the read and verify operations, the select gates (SGD and SGS) and the unselected word lines (WL0, WL1 and WL3) are raised to a read pass voltage of 4.5V to make these as pass gates. The selected word line (WL2) is connected to a voltage a level of which is specified for each read and verify operation in order to determine whether a threshold voltage of the concerned memory cell has reached such level. For example, in a READ 10 operation, the selected word line WL2 is grounded, so that it is detected whether the threshold voltage is higher than 0V. In this read case, it can be said that a read level is 0V. In a VERIFY 01 operation, the selected word line WL2 is connected to 2.4V, so that it is verified that whether the threshold voltage has reached 2.4V. In this verify case, it can be said that a verify level is 2.4V.

The selected bit lines (BLe) are precharged to a high level, for example 0.7V. If the threshold voltage is higher than the read or verify level, the potential level of the concerned bit line (BLe) maintains the high level, because of the non-conductive memory cell (M). On the other hand, If the threshold voltage is lower than the read or verify level, the potential level of the concerned bit line (BLe) decreases to a low level, for example less than 0.5V, because of the conductive memory cell (M). Further details of the read and verify operations are explained below.

FIG. 7 shows a part of the column control circuit 2 of FIG. 1. Each pair of bit lines (BLe and BLo) is coupled to a data storage portion 16 which includes two data storage (DS1 and DS2) registers, each being capable of storing one bit of data. The data storage portion 16 senses the potential level of the selected bit line (BL) during read or verify operation and then stores the data in a binary manner, and controls the bit line voltage in the program operation. The data storage portion 16 is selectively connected to the selected bit line (BL) by selecting one of signals of "EVENBL" and "ODDBL". The data storage portion 16 is also coupled to the I/O line to output the read data and to store the program data.

The I/O line is connected to the data input/output buffer 6, as described above with respect to FIG. 1.

General Operation of the Memory System

FIG. 8 illustrates threshold voltage distributions for the memory cell array 1 when each floating gate storage element stores two bits of data, namely four data states, in each memory cell (M). The curve 25 represents a distribution of the threshold levels $V_T$ of the cells within the array 1 that are in the erased state ("11" data state), being negative threshold voltage levels. Threshold voltage distributions 26 and 27 of memory cells storing "10" and "00" user data, respectively, are shown to be between 0V and 1V and between 1V and 2V. A curve 28 shows the distribution of cells that have been programmed to the "01" data state, being the highest threshold voltage level set more than 2V and less than 4.5V of the read pass voltage.

Each of the two bits stored in a single memory cell (M), in this example, is from a different logical page. That is, each bit of the two bits stored in each memory cell carries a different logical page address from each other. The right side bit shown in FIG. 8 is accessed when a lower page address (=0, 2, 4, . . . , 16,382) is input. The left side bit is accessed when an upper page address (=1, 3, 5, . . . , 16,383) is input.

In order to provide improved reliability, it is better for the individual distributions to be tightened (distribution narrowed), because the tighter distribution brings a wider read margin (distance between them). According to the present invention, the distribution width is made tighter without a conspicuous degradation in the programming speed.

According to the article "Fast and Accurate Programming Method for Multi-level NAND EEPROMs, pp 129–130, *Digest of* 1995 *Symposium on VLSI Technology*," which article is incorporated herein by this reference, in principle, limiting a distribution to a 0.2V-width requires that the usual repetitive programming pulses be incremented 0.2V between steps. To tighten the distribution within a 0.05V-width, 0.05V-step-up pulses are required. In order to program cells with such small step increments in programming voltage results in increasing the programming time by a factor of 4. However, according to the principle aspects of the present invention, described below, such significant increases in programming time are unnecessary to reduce the width of a threshold voltage distribution.

FIGS. 9A and 9B show an existing programming pulse technique and a resulting threshold distribution width of cells programmed to a particular state, respectively. A programming voltage Vpgm waveform is illustrated in FIG. 9A. The programming voltage Vpgm is divided into many of pluses, and increased 0.2V pulse by pulse. It can be said a Vpgm step size is 0.2V. The starting level of Vpgm is 12V, in this particular example. The change of the threshold voltage of the fastest-program memory cell is represented by the white squares of FIG. 9B, the slowest by the black squares. The fastest programmed memory cell is reached the verify level for 1stPass after 14V-pluse. The maximum width of the resulting distribution is $\Delta V_T=0.2V$.

In periods between the pluses, the program verify operations are carried out. That is, the programmed level of each cell being programmed in parallel is read between each programming pulse to determine whether it is equal to or greater than the verify level to which it is being programmed. If it is determined that the threshold voltage of a given memory cell has exceeded the verify level, Vpgm is removed by raising the voltage of the bit line to which the series cell unit of the given cell is connected from 0V to Vdd. Programming of others of the cells being programmed in parallel continues until they in turn reach their verify levels. When the threshold voltage moves from below the verify level to above it during the cell's last programming pulse, the shift of the threshold voltage is equal to the Vpgm step size of 0.2V. Therefore, the threshold voltages are controlled within a 0.2V-width.

FIGS. 10A and 10B illustrate a specific existing technique of programming a 4-state NAND memory cell in an array of the type described above. In a first programming pass, the cell's threshold level is set according to the bit from the lower logical page. If that bit is a "1", nothing is done since it is in that state as a result of having been earlier erased. However, if that bit is a "0", the level of the cell is increased to the first programmed state 34. That concludes the first programming pass.

In a second programming pass, the cell's threshold level is set according to the bit being stored in the cell from the upper logical page. If a "1", no programming occurs since the cell is in one of the states 33 or 34, depending upon the programming of the lower page bit, both of which carry an upper page bit of "1". If the upper page bit is a "0", however, the cell is programmed a second time. If the first pass resulted in the cell remaining in the erased state 33, the cell is programmed from that state to the highest most state 36, as shown by the upper arrow FIG. 10B. If the cell has been programmed into the state 34, however, as a result of the first programming pass, the cell is further programmed in the second pass from that state to the state 35, as shown by the lower arrow of FIG. 10B. The result of the second pass is to program the cell into the state designated to store a "0" from the upper page without changing the result of the first pass programming.

Of course, if the memory is operated with more than four states, there will be a number of distributions within the defined voltage threshold window of the memory cells that is equal to the number of states. Further, although specific bit patterns have been assigned to each of the distributions, different bit patterns may be so assigned, in which case the states between which programming occurs can be different than those shown in FIGS. 10A and 10B. A few such variations are discussed in the Toshiba patents previously referenced in the Background.

Normally, the cells being programmed in parallel are alternate ones along a word line. FIG. 11 illustrates three memory cells 41, 42 and 43 of a much larger number of cells along one word line 44. One set of alternate cells, including the cells 41 and 43, store bits from logical pages 0 and 2 ("even pages"), while the other set of alternate cells, including the cell 42, store bits from logical pages 1 and 3 ("odd pages"). This results in the programming of at least 4 pages of data in a single row of memory cells, in one complete programming cycle that is repeated in sequence for 4 pages of data at a time.

In the first steps of programming the memory cells of at least a portion of a row as described above with respect to FIGS. 10A and 10B, a bit from the lower 0 page is programmed first into the individual first set of alternate cells and then a bit from the lower page 1 into the individual second set of alternate cells. After these steps, the "11" (also the erased state) and "10" programmed state distributions of both Pages 0,2 and Pages 1,3 exist as shown in solid lines in FIG. 11. The bits from the upper page 2 are then programmed into the first set of alternate cells, followed by a final step of programming bits of the upper page 3 into the second set of alternate cells. Because of the Yupin effect discussed above, the apparent distributions of the "11" and "10" states become broader than the threshold distributions indicated by the solid lines that exist immediately after their programming, as shown by the broadening dashed lines. This is because the initial programming of data of the lower pages 0 and 1 is done in an environment where no adjacent floating gates contain the higher charge levels that represent the "00" and "01" states. The broadening of the apparent initial distributions occurs when adjacent cells are programmed to these higher threshold level states. Further, the higher states "00" and "01" of Pages 0,2 also suffer this apparent broadening effect since adjacent floating gates are written with data from page 3 to increase their charge levels to the "00" and "01" states of the odd pages.

The effect of this apparent broadening is to place a limit on the number of states in which the memory may be operated, and to create other operational limitations. It requires maintaining a sufficiently large margin between the state distributions so that the broader apparent distributions can be clearly distinguished during data read operations. Only the last two states programmed for Pages 1,3, as shown in FIG. 11 without the dashed threshold level spreading having occurred, are unaffected by the Yupin effect, since the charge levels of the adjacent floating gates are not changed thereafter. As illustrated in FIG. 10B, the "00" and "01" states of the memory cells storing bits from Pages 1,3 of FIG. 11 are programmed last. For each of the other six states of the cells storing bits from Pages 0,2 and 1,3, however, there is subsequent programming of adjacent cells that affects the extent of their apparent threshold voltage distributions because of the field coupling between the floating gates.

Examples of New Programming Techniques

FIG. 12 illustrates the effect of two improvements in the programming techniques described above with respect to FIGS. 9–11. First, the order in which the pages are programmed is altered so that the first two pages of data bits that are programmed are written into the first alternate memory cells in a row, followed by writing the next two pages of data bits into the second alternate cells. This has the effect of eliminating two additional programmed states from the Yupin effect. Secondly, the initial state distributions are narrowed (compacted) so that the remaining apparent spreading by the Yupin effect still leaves the breadth of the effective distributions small, preferably no wider than the actual distributions first programmed. Each of these improvements may beneficially be implemented alone, or they may be used together. The example of FIG. 12 shows them being used together.

With the same data pages designated for the first and second groups of alternate memory cells being programmed as in FIG. 11, the first improvement shown in FIG. 12 is the sequential writing of data from both pages 0 and 2 into the first group of cells, followed by writing data from both pages 1 and 3 into the second group of cells. That is, instead of alternately writing four pages of data into the first and second groups of alternate cells, as is done in the example of FIG. 11, the first group is programmed with both pages of data before the second group is programmed with any data. The second group of alternate memory cells is then programmed with the third and fourth pages of data. The result is the elimination of the Yupin effect with respect to the state "10" of the memory cells storing Pages 1,3, as illustrated. This is because there is no increase in the charge level of floating gates of the immediately adjacent first group of alternate memory cells (storing Pages 0,2) after the second set of cells has been programmed with data Pages 1,3. All three of the programmed states of Pages 1,3 are then free of the Yupin effect, thus reducing the probability of an incorrect reading of the stored Pages 1,3 of data.

But because the second alternate set of memory cells is programmed with data Pages 1,3 after the first set of cells has been programmed with data Pages 0,2, the storage states of the first set are subject to the Yupin effect. In order to overcome this, the threshold voltage distributions of the first set of cells are compacted. A distribution 51 results from the initial programming of the data page 0, in accordance with FIG. 10A. Before the data page 2 is programmed, however, that distribution is re-programmed to reduce the width of the distribution, as indicated by the curve 52. After the programming of all four pages is complete, the Yupin effect causes the apparent spread of the "10" state threshold distribution to expand to that indicated by the curve 53. The apparent distribution 53 is preferably controlled to be equal to or less than that of the initial distribution 51.

The same process is performed when programming data page 2 into one of the programmed states "00" and "01", which is carried out after data page 0 is programmed and compacted. The data are first written into the first group of alternate cells, compacted and then effectively spread by the Yupin effect from the later programming of the adjacent second group of alternate cells.

FIG. 13 illustrates the steps performed to accomplish each of the two compactions of state distributions that are shown in FIG. 12 to occur. The state is first programmed with data against a first verify level 61. That is, after each programming voltage pulse applied to the cells being programmed into that state, those cells are read by applying appropriate voltage conditions to them to determine whether the threshold voltage levels of the individual cells have reached or exceeded the level 61. If so, programming stops. If not, an additional programming pulse is applied and the state read again. The result is a population of memory cells programmed into the given state that have a voltage threshold distribution indicated by the curve 62. The width of the distribution 62 is controlled by the magnitude of the programming pulses applied, primarily a change of voltage between pulses, as previously described.

In order to narrow that distribution, after the programming of all the cells in parallel into that state has been completed, their states are read by using a threshold level 63 that is lower than the level 61. This distinguishes cells programmed into other states by reading only those programmed into the one state of interest. Alternately, the data can be obtained from a register if available. A second programming operation (second pass) of those cells into that state then occurs by using a threshold voltage verify level 64 that is higher than the first verify level 61 and positioned within the distribution 62. The effect of this second programming operation is to re-program those cells with a programmed threshold level that is less than the level 64 to a level that is greater than the verify level 64, as indicated by a distribution 65. The actual threshold level distribution 65 is, it can be noted from FIG. 13, narrower that the original distribution 62. After other adjacent cells are programmed by increasing their stored charge levels, the apparent distribution then widens due to the Yupin effect, as indicated by the distribution 66. The width of this apparent distribution 66 is narrower that that which would occur if the second programming pass is not made, by an amount approximately equal to the difference between the verify levels 61 and 64.

FIGS. 14A and 14B illustrate a modification of the programming method illustrated in respective FIGS. 9A and 9B that includes the second programming pass that was described with respect to FIG. 13. The use of the second programming pass (2ndPassWrite) procedure is shown, as well as different verify levels for the first pass (61) and for the second pass (64). The change of the threshold voltage of the fastest-program memory cell is represented by the white squares of FIG. 14B, the slowest by the black squares. The first programming pass (1stPassWrite) is similar to existing programming procedures, but a relatively low verify level 61 is used. The verify level 64 used for the second programming pass can be the same as the verify level now used.

When the threshold voltage moves from below the first pass verify level 61 as the result of one programming pulse, the shift of the threshold voltage is equal to the ΔVpgm step size of 0.2V, in this example. Therefore, the threshold voltages are controlled within a distribution 62 having a 0.2V-width, which is the same as that of the current techniques, but the distribution is positioned lower than that resulting from current techniques because of the lower verify level 61.

After the 1stPassWrite is completed and before the 2ndPassWrite is begun, the memory cells that have threshold voltages higher than the verify level 61 for the 1stPassWrite and lower than the verify level 64 for the 2ndPassWrite are targets for the 2ndPassWrite. If the fastest-program memory cell reaches the verify level 61 for the 1stPassWrite after a 13.8V-pluse, for example, the starting Vpgm level of the 2ndPassWrite is set at 13.4V or less than 13.4V, thereby decreasing the threshold voltage shift below 0.2V. In a specific example, the starting programming voltage Vpgm level of the 2ndPassWrite is set at 13.4V, that of the 1stPassWrite at 12V. When the threshold voltage of a cell passes from below the verify level 64 to above it as the result of one programming pulse of the 2ndPassWrite, the shift of the threshold voltage is maintained less than 0.05V. Therefore, the distribution of threshold voltages of the target memory cells are controlled within a 0.05V-width, which is much tighter than that currently obtained. Therefore, if the verify level 61 for the 1stPassWrite is at least 0.15V lower than that the verify level 64 for the 2ndPassWrite, the total width of the threshold voltage distribution is 0.05V.

The maximum Vpgm level of the 2ndPassWrite is 0.2V higher than that of the 1stPassWrite in the worst case, in this specific example, because of the 0.15V-higher verify level used in the second pass. In addition, since the starting Vpgm in the 2ndPassWrite can be much higher than that in the 1stPassWrite, the time length of the 2ndPassWrite is always shorter than that of the 1stPassWrite. So, it can be seen that the cost in performance resulting from reducing the threshold voltage distribution width from 0.2V to 0.05V by this two programming pass technique is less than a doubling of the programming time. In an existing programming technique that obtains the same narrow programming distribution width by using a 0.05V ΔVpgm step size, on the other hand, the programming time is prolonged by a factor of 4 from the case where the width is 0.2V. The two programming pass technique obtains programming times that are over twice as fast as the existing technique in order to obtain the same threshold voltage distribution.

FIGS. 15A and 15B correspond to respective FIGS. 14A and 14B in showing a modification thereof, wherein the ΔVpgm step size of the first programming pass is made larger, in order to shorten the programming time, while that of the second programming pass remains the same to define a narrow distribution width. The ΔVpgm step size of the 1stPassWrite is raised from 0.2V to 0.4V, in this specific example. The verify level for the 1stPassWrite is decreased 0.2V, and the difference between the verify levels for 1stPassWrite and for 2ndPassWrite is expanded 0.2V to at least 0.35V. The expansion of 0.2V is equal to the difference between the ΔVpgm step sizes (0.4V–0.2V). The starting levels of the programming voltage Vpgm for the 1stPass-Write and the 2ndPassWrite are the same as in the 0.2V-step Vpgm case of FIG. 14A. The duration of the 1stPassWrite is cut by about one-half, thereby reducing the program time by more than 25% from that in the 0.2V-step Vpgm case of FIGS. 14A and 14B.

In each of FIGS. 14A and 15A, the initial few programming pulses of 1stPassWrite may alternatively be generated without the necessity of time between them (not shown) for reading and verifying the level programmed in the target memory cells. This is because the target cells are seldom programmed to their desired threshold levels on the first few pulses. This may also be done with the first few pulses of the 2ndPassWrite. The result is a further decrease in the programming time.

The specific embodiments described above with respect to FIGS. 12–15 compact a programmed distribution in a reprogramming step immediately after the initial programming, before proceeding to program the adjacent cells and thus before the initially programmed states are distorted by the Yupin effect. In the specific embodiments described below with respect to FIGS. 16–18, the distribution compacting reprogramming step occurs at a later stage, after all the states have been initially programmed and thus after there a distortion of the threshold level distributions exists because of the Yupin effect.

Referring to FIG. 16, a programming technique is illustrated wherein Pages 0,2 are first programmed into the first group of alternate storage elements along a row, followed by programming Pages 1,3 into the second group of alternate storage elements along the same row. Because one group is fully programmed with data from both of its pages before the other group of storage elements is programmed, there is no apparent broadening of the state distributions of the last to be programmed pages, in this case Pages 1,3, due to the Yupin effect. There is, however, such apparent broadening of the state distributions of the first programmed pages, namely Pages 0,2, because of the capacitive coupling between the adjacent alternating storage elements of the first and second groups along the selected word line. One way to correct for the apparent distribution shift of Pages 0,2 is to reprogram the first group of storage elements with the same data in a normal manner, with the same verify level being used. This results in shifting the state distributions of Pages 0,2 since their reprogramming is performed under the influence of the charge levels of adjacent storage elements. The new reprogrammed distributions then correct for the Yupin effect on the initially programmed data, Pages 0,2 in this case.

However, it is usually desirable to compact the state distributions being reprogrammed at the same time. There is no performance degradation by doing so since the main step in compaction is reprogramming with a different verify level. This has already been explained with reference to FIG. 13, where the compacting reprogramming occurs before the adjacent storage elements are programmed that then affect the compacted state distributions. In the case of the programming sequence illustrated in FIG. 16, however, the compacting reprogramming occurs after the adjacent storage elements have been programmed.

FIG. 17 illustrates the compacting reprogramming of the state distributions for the data Pages 0,2, in the programming sequence of FIG. 17. After the initial programming of Pages 0,2 with a verify level 71, and before programming pages 1,3, the distribution of each state appears as indicated by a curve 72. After the programming of Pages 1,3, however, this distribution appears to be broader, as indicated by the curve 75. Upon reading cells in this state with a read level 73 and reprogramming them with a verify level 74, an apparent distribution indicated by a curve 76 is the result, while the actual distribution is indicated in a dotted line 77. The programming and reprogramming pulses applied are similar to those shown in FIG. 14A. The desired compaction is shown to have occurred by the apparent distribution 76 being narrower than the apparent distribution 75.

FIGS. 18 and 19 illustrate the same programming sequence and reprogramming steps as respective FIGS. 16 and 17, except that the initial programming is performed with programming voltage pulses (1stPassWrite) that increase 0.4V per pulse while the reprogramming voltage pulses (2ndPassWrite) increase 0.2V per pulse, in the same manner as shown in FIG. 15A. This higher ΔVpgm on the initial programming pass shortens the time necessary to complete the programming and reprogramming process.

FIG. 20 illustrates another possible programming technique that uses the various aspects of the present invention. The method includes that described with respect to FIGS. 12 and 13, followed by additional steps of reprogramming the initial data Pages 0,2 a second time. The second reprogramming occurs after the other data Pages 1,3 have been programmed, and need not necessarily include compaction of the state distributions but can.

Although exemplary embodiments of the first two aspects of the present invention set forth in the Summary have been described for a flash EEPROM system having a NAND memory cell array architecture, it will be recognized that these and other aspects of the present invention can be applied to any other flash memory architecture (such as a flash EEPROM system having a NOR memory cell architecture) or other type of non-volatile memory where there is some coupling between storage elements that affects an apparent distribution of stored levels representing the same memory state, and it is desired to minimize that effect.

Exemplary Programming Algorithms

FIG. 21 shows an example algorithm for programming the even columns of the lower page according to the technique described with respect to FIGS. 12, 13 and 14. The algorithm can be divided into three parts. The first is a part surrounded by a broken line (S1 to S4). This part shows procedures of the interface. At first (S1), "data load" command is issued by the flash controller and input to the data input/output buffer (6). The input data are recognized as the command and latched in the state machine (8), because a command latch signal not illustrated is input to the command interface (7) at this time. Next (S2), address data designating the page address is input to the data input/output buffer (6) from the controller, and then latched. The input data are recognized as the page address and latched in the state machine (8), because an address latch signal not illustrated is input to the command interface (7) at this time. Continuously (S3), 532B-program-data are input to the data input/output buffer (6). The input data are latched in the data storage 1 (DS1), because the "data load" command has been latched at this time. At the end (S4), "program" command is issued by the flash controller and input to the data input/output buffer (6). The input data are recognized as the command and latched in the state machine (8), because the command latch signal is input to the command interface (7) at this time. Triggered by the "program" command, the data latched in the data storage 1 (DS1) are automatically programmed (S5 to S20) into the selected memory cells (M) controlled by the state machine (8).

The second part of the algorithm is the 1stPassWrite of the steps of S5 to S10. At first, the starting Vpgm is set at 12V and a program counter embedded in the state machine (8) is initialized at 0 (S5). Next, the first program pulse is applied to the selected word line, for example WL2 as shown in the table I (S6). If "0"-data is latched in the data storage 1 (DS1), corresponding bit line (BL) is grounded ("program promotion" in the table I). On the other hand, if "1"-data is latched in the data storage 1 (DS1), corresponding bit line (BL) is connected to Vdd ("program inhibition" in the table I).

After the program, the states of the selected memory cells are verified. In order to verify, the verify 10 for 1stPass is carried out (S7). In this operation, it is detected whether the threshold voltage has reached the verify level for 1stPass of 0.2V as shown in the table I. If it is detected that the threshold voltage has reached, the "0"-data latched in DS1 is changed to "1"-data. If it is detected that the threshold voltage has not reached, the "0"-data latched in DS1 is maintained. Already existing "1"-data is also maintained. In this manner, since "0"-data are changed to "1"-data one after another and "1"-data are maintained independent of the states of the memory cells, at last all of the data latched in the data storage DS1 become "1"-data. It means that all of the memory cells have been programmed successfully judging from the verify level for 1stPass.

After the verify operation, it is checked whether all of the data latched in the data storage DS1 have become "1"-data (S8). If they have become "1"-data, the 1stPassWrite is terminated and the 2ndPassWrite starts. If they haven't become "1"-data, the algorithm goes to a step S9.

In the step S9, a count value that the program counter has is checked. If the count value is smaller than 20, the Vpgm level is increased 0.2V and the count value progresses by 1 (S10), and then the algorithm returns to the step S6 of the program. If the count value is not smaller than 20, a status data in the state machine is set at "FAIL", and then the algorithm is terminated (S11).

The third part of the algorithm is the 2ndPassWrite (S12 to S20). At first, the read 10 for 2ndPass is carried out (S12). In this operation, the memory cells, that have the threshold voltage higher than 0V, are extracted, and then "0"-data is set into the corresponding data storages 1 (DS1). "1"-data is set into each of remaining data storages 1 (DS1).

Next, the verify 10 for 2ndPass is carried out (S13). In this operation, the memory cells, that have the threshold voltage higher than 0V and lower than 0.4V, are extracted by using the verify level for 2stPass of 0.4V and the data already stored in the data storages 1 (DS1). It is detected whether the threshold voltage has reached the verify level for 2stPass of 0.4V as shown in the table I. If it is detected that the threshold voltage has reached, the "0"-data latched in DS1 is changed to "1"-data. If it is detected that the threshold voltage has not reached, the "0"-data latched in the data storage 1 (DS1) is maintained. Already existing "1"-data is also maintained.

After the verify 10 for 2ndPass (S13), the starting Vpgm is reset at 13.4V and the program counter is re-initialized at 0 (S14). Next, the first program pulse of 13.4V is applied to the selected word line, as shown in the table I (S15). If "0"-data is latched in the data storage 1 (DS1), corresponding bit line (BL) is grounded ("program promotion" in the table I). On the other hand, if "1"-data is latched in the data storage 1 (DS1), corresponding bit line (BL) is connected to Vdd ("program inhibition" in the table I).

After the program (S15), the states of the selected memory cells are verified. In order to verify, the verify 10 for 2ndPass is carried out (S16). In this operation, it is detected whether the threshold voltage has reached the verify level for 2ndPass of 0.4V as shown in the table I. If it is detected that the threshold voltage has reached, the "0"-data latched in DS1 is changed to "1"-data. If it is detected that the threshold voltage has not reached, the "0"-data latched in DS1 is maintained. Already existing "1"-data is also maintained. In this manner, since "0"-data are changed to "1"-data one after another and "1"-data are maintained independent of the states of the memory cells, at last all of the data latched in the data storage DS1 become "1"-data. It means that all of the memory cells have been programmed successfully.

After the verify operation (S16), it is checked whether all of the data latched in the data storage DS1 have become "1"-data (S17). If they have become "1"-data, the 2ndPassWrite is terminated and then whole program algorithm is terminated setting the status data at "PASS" (S20). If they haven't become "1"-data, the algorithm goes to a step S18.

In the step S18, the count value that the program counter has is checked. If the count value is smaller than 13, the Vpgm level is increased 0.2V and the count value progresses by 1 (S19), and then the algorithm returns to the step S15 of the program. If the count value is not smaller than 13, the status data is set at "FAIL", and then the algorithm is terminated (S11).

FIG. 22 shows an example program algorithm for programming the even columns of the upper page according to the method illustrated in FIGS. 12, 13 and 14. The algorithm can be divided into three parts. The first is a part surrounded by a broken line (S1 to S4). This part is the same as the part of the steps of S1 to S4 shown in FIG. 21.

The second part of the algorithm is the 1stPassWrite of the steps of S5 to S13. At first, the read 10 for 1stPass is carried out (S5). In this operation, the memory cells, that have the threshold voltage higher than 0V, are extracted, and then "0"-data is set into respective one of the corresponding data storages 2 (DS2). "1"-data is set into each of remaining data storages 2 (DS2). The starting Vpgm is set at 14V and the program counter is initialized at 0 (S6). Next, the first program pulse is applied to the selected word line, for example WL2 as shown in the table I (S7). If "0"-data is latched in the data storage 1 (DS1), corresponding bit line (BL) is grounded ("program promotion" in the table I). On the other hand, if "1"-data is latched in the data storage 1 (DS1), corresponding bit line (BL) is connected to Vdd ("program inhibition" in the table I).

After the program, the states of the selected memory cells are verified. In order to verify, the verify 01 is carried out (S8) in the first place. In this operation, it is detected whether the threshold voltage has reached the verify level 2.4V as shown in the table I. If it is detected that the threshold voltage has reached, the "0"-data latched in DS1 is changed to "1"-data. If it is detected that the threshold voltage has not reached, the "0"-data latched in DS1 is maintained. Already existing "1"-data is also maintained. In the second place, the verify 00 for 1stPass is carried out (S9). In this operation, it is detected whether the threshold voltage has reached the verify level 1.2V as shown in the table I. If it is detected that the threshold voltage has reached and if the stored data in the corresponding data storage 2 (DS2) is "0"-data, the "0"-data latched in DS1 is changed to "1"-data. The "0"-data stored in the data storage 1 (DS1) is maintained in the case that the associated data storage 2 (DS2) has the "1"-data, independent of the detected result. If it is detected that the threshold voltage has not reached, the "0"-data latched in DS1 is maintained. Already existing "1"-data is also maintained.

In this manner, since "0"-data are changed to "1"-data one after another and "1"-data are maintained independent of the states of the memory cells, at last all of the data latched in the data storage DS1 become "1"-data. It means that all of the memory cells have been programmed successfully judging from the verify level of the "01"-state and the verify level for 1stPass of the "00"-state.

After the verify operation, it is checked whether all of the data latched in the data storage DS1 have become "1"-data (S10). If they have become "1"-data, the 1stPassWrite is terminated and the 2ndPassWrite starts. If they haven't become "1"-data, the algorithm goes to a step S11.

In the step S11, the count value that the program counter has is checked. If the count value is smaller than 20, the Vpgm level is increased 0.2V and the count value progresses by 1 (S12), and then the algorithm returns to the step S7 of the program. If the count value is not smaller than 20, the status data in the state machine is set at "FAIL", and then the algorithm is terminated (S13).

The third part of the algorithm is the 2ndPassWrite (S14 to S22). At first, the read 00 for 2ndPass is carried out (S14). In this operation, the memory cells, that have the threshold voltage higher than 1V, are extracted, and then "0"-data is set into respective one of the corresponding data storages 1 (DS1). "1"-data is set into each of remaining data storages 1 (DS1).

Next, the verify 00 for 2ndPass is carried out (S15). In this operation, the memory cells, that have the threshold voltage higher than 1V and lower than 1.4V, are extracted by using the verify level for 2stPass of 1.4V and the data already stored in the data storages 1 (DS1). It is detected whether the threshold voltage has reached the verify level for 2stPass of 1.4V as shown in the table I. If it is detected that the threshold voltage has reached, the "0"-data latched in DS1 is changed to "1"-data. If it is detected that the threshold voltage has not reached, the "0"-data latched in the data storage 1 (DS1) is maintained. Already existing "1"-data is also maintained.

After the verify 00 for 2ndPass (S15), the starting Vpgm is reset at 14.4V and the program counter is re-initialized at 0 (S16). Next, the first program pulse of 14.4V is applied to the selected word line, as shown in the table I (S17). If "0"-data is latched in the data storage 1 (DS1), corresponding bit line (BL) is grounded ("program promotion" in the table I). On the other hand, if "1"-data is latched in the data storage 1 (DS1), corresponding bit line (BL) is connected to Vdd ("program inhibition" in the table I).

After the program (S17), the states of the selected memory cells are verified. In order to verify, the verify 00 for 2ndPass is carried out (S18). In this operation, it is detected whether the threshold voltage has reached the verify level for 2ndPass of 1.4V as shown in the table I. If it is detected that the threshold voltage has reached, the "0"-data latched in DS1 is changed to "1"-data. If it is detected that the threshold voltage has not reached, the "0"-data latched in DS1 is maintained. Already existing "1"-data is also maintained. In this manner, since "0"-data are changed to "1"-data one after another and "1"-data are maintained independent of the states of the memory cells, at last all of the data latched in the data storage DS1 become "1"-data. It means that all of the memory cells have been programmed successfully.

After the verify operation (S18), it is checked whether all of the data latched in the data storage DS1 have become "1"-data (S19). If they have become "1"-data, the 2ndPassWrite is terminated and then whole program algorithm is terminated setting the status data at "PASS" (S22). If they haven't become "1"-data, the algorithm goes to a step S20.

In the step S20, the count value that the program counter has is checked. If the count value is smaller than 13, the Vpgm level is increased 0.2V and the count value progresses by 1 (S21), and then the algorithm returns to the step S17 of the program. If the count value is not smaller than 13, the status data is set at "FAIL", and then the algorithm is terminated (S13).

In the algorithm of FIG. 22, the 2ndPassWrite on the memory cells to be programmed to "01"-state is avoided, because the 2ndPassWrite for "01"-state requires the maximum Vpgm again and it results in an unnecessary program disturb. However, it can be easily done according to the present invention, if necessary.

FIG. 23 shows an example program algorithm to carry out the method illustrated in FIGS. 12, 19 and 15 for programming the even columns with the lower page of data. This algorithm is similar to that shown in FIG. 21. The differences are the Vpgm step size of the 1stPassWrite (S10) and the related maximum count value of the program counter in the 1stPassWrite (S9). The Vpgm step size is increased from 0.2V to 0.4V to accelerate the 1stPassWrite.

FIG. 24 shows an example program algorithm to carry out the method illustrated in FIG. 12, 19 and 15 for programming the even columns with the upper page of data. This algorithm is similar to that shown in FIG. 22. The differences are the Vpgm step size of the 1stPassWrite (S12) and the related maximum count value of the program counter in the 1stPassWrite (S11). The Vpgm step size is increased from 0.2V to 0.4V to accelerate the 1stPassWrite.

Figure 26:
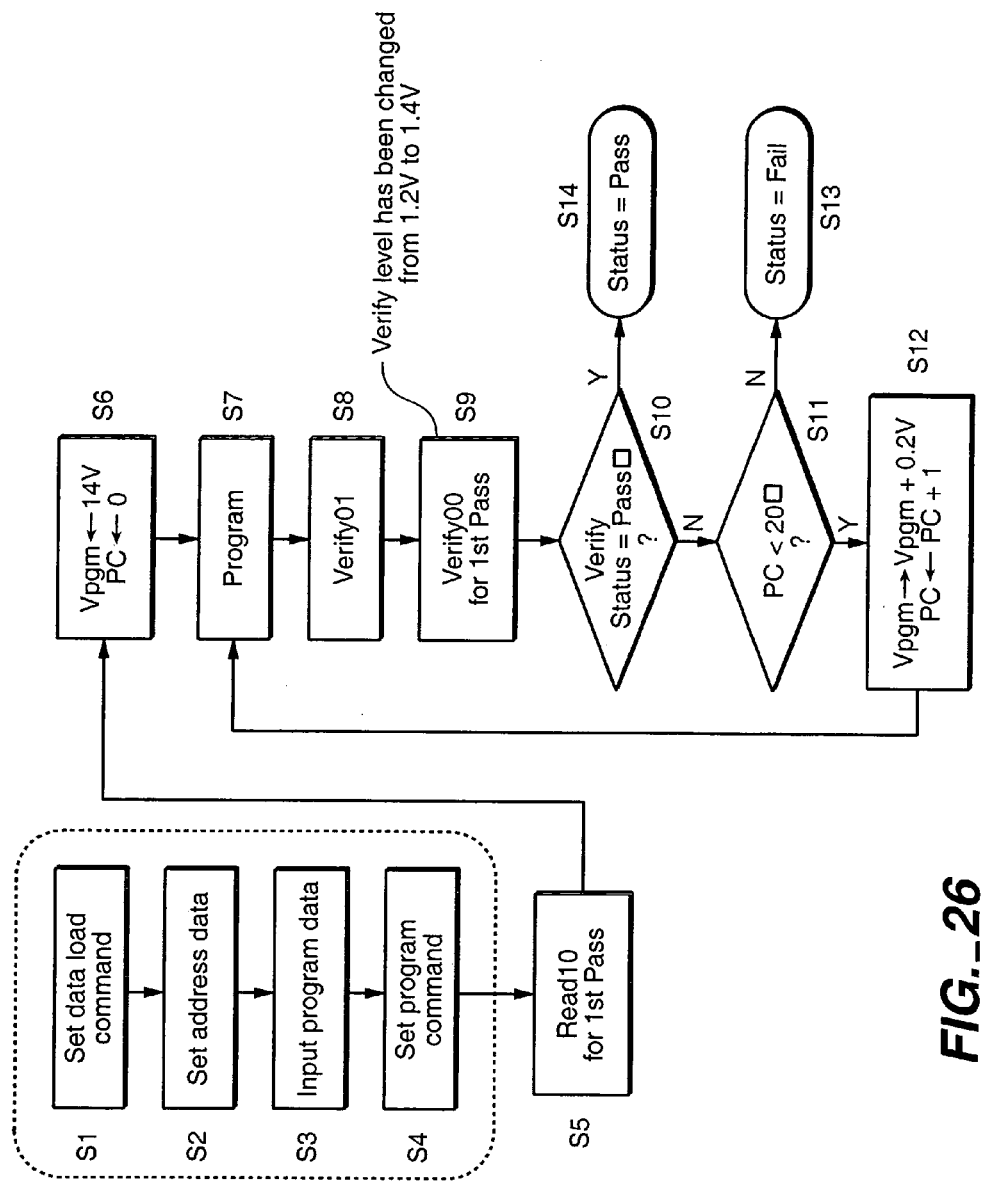
FIG. 26 is a flow chart showing, when combined with FIG. 22, a second part of the third exemplary embodiment of a method of programming the memory cell array of FIGS. 2–5.

FIGS. 25 and 26 show example program algorithms for, when combined with the program algorithms of FIGS. 21 and 22, respectively, carry out the method illustrated in FIGS. 12, 13 and 14. The algorithm of FIG. 25 shows programming the odd columns without the 2ndPassWrite that is employed in the algorithm shown in FIG. 21 to program the even columns. The verify level of the verify 10 for 1stPass is changed from 0.2V to 0.4V in order to set the distribution more than 0.4V as set the distribution more than 0.4V through the 2ndPassWrite. FIG. 26 shows programming the odd columns without the 2ndPassWrite that is employed in the algorithm shown in FIG. 22 to program even columns. The verify level of the verify 00 for 1stPass is changed from 1.2V to 1.4V in order to set the distribution more than 1.4V as set the distribution more than 1.4V through the 2ndPassWrite. The combination of algorithms illustrated in FIGS. 21, 22, 25, and 26 compensate for the Yupin effect. As a result, the program throughput is improved.

FIGS. 27 and 28 show example algorithms for, when combined with the program algorithms shown in FIGS. 23 and 24, carry out the method of FIGS. 12, 19 and 15. FIG. 27 shows programming the odd columns without the 2ndPassWrite that is employed in the algorithm shown in FIG. 23 to program the even columns. The verify level of the verify 10 for 1stPass is changed from 0.2V to 0.4V in order to set the distribution more than 0.4V as set the distribution more than 0.4V through the 2ndPassWrite. FIG. 28 shows programming the odd columns without the 2ndPassWrite that is employed in the algorithm shown in FIG. 24 to program the even columns. The verify level of the verify 00 for 1stPass is changed from 1.2V to 1.4V in order to set the distribution more than 1.4V as set the distribution more than 1.4V through the 2ndPassWrite.

The combination of the algorithms illustrated in FIGS. 23, 24, 27 and 28 compensate for the Yupin effect. As a result, the program throughout is greatly improved.

FIG. 29 shows an example program sequence for implementing the method described with respect to FIGS. 12, 13 and 14. In each block, the data programming is carried out in order of the page address from the lower page of the even bit lines of the word line WL0 to the upper page of the odd bit lines of the word line WL3. This sequence is generated taking into account the Yupin effect.

FIG. 30 shows an example read algorithm for reading the lower page of data that has been compacted according to the method of FIGS. 16 and 17. A part surrounded by a broken line (S1 and S2) shows procedures of the interface. At first (S1), "data read" command is issued by the flash controller and input to the data input/output buffer (6). The input data are recognized as the command and latched in the state machine (8), because the command latch signal not illustrated is input to the command interface (7) at this time. Next (S2), the address data designating the page address is input to the data input/output buffer (6) from the controller, and then latched. The input data are recognized as the page address and latched in the state machine (8), because the address latch signal not illustrated is input to the command interface (7) at this time. Triggered by the address data, the data stored in the selected memory cells (M) are automatically read out (S4 and S5) controlled by the state machine (8).

In the read 01, the memory cells, that have the threshold voltage higher than 2V, are extracted, and then "1"-data is set into respective one of the corresponding data storages 2 (DS2). "0"-data is set into each of remaining data storages 2 (DS2). Next, the read 10 is carried out. In this operation, the memory cells, that have the threshold voltage lower than 0V or higher than 2V, are extracted. If it is detected that the threshold voltage is lower than 0V or the data storage 2 (DS2) is storing the "1"-data, the "1"-data is set into the data storage 1 (DS1), otherwise "0".

The stored data in the data storage 1 (DS1) are output via the data input/output buffer (6) to the external in sync with a readout signal (not illustrated) input to the command interface (7).

FIG. 31 shows an example read algorithm for reading the upper page of data that has been compacted according to the method of FIGS. 16 and 17. A part surrounded by a broken line (S1 and S2) is the same as that shown in FIG. 30. In the read 00, the memory cells, that have the threshold voltage higher than 1V, are extracted, and then "0"-data is set into respective one of the corresponding data storages 1 (DS1). "1"-data is set into each of remaining data storages 1 (DS1). The stored data in the data storage 1 (DS1) are output via the data input/output buffer (6) to the external in sync with the readout signal.

Although the various aspects of the present invention have been described with respect to specific embodiments, it will be understood that the invention is protected within the full scope of the appended claims.

It is claimed:

1. A method of operating a non-volatile memory having an array of semiconductor memory cells organized into blocks that are erased together prior to re-programming memory cells thereof, wherein charge levels stored in some charge storage elements of the memory cells affect readings from other charge storage elements on account of at least electric field coupling between neighboring storage elements, comprising:

storing in a first group of storage elements a first set of charge levels corresponding to a first set of data, thereafter storing in a second group of storage elements different from the first group a second set of charge levels corresponding to a second set of data, wherein at least some of the stored second set of charge levels affect values read from memory cells including at least some of the first group of storage elements because of at least field coupling between the storage elements, and altering the first set of stored charge levels of the first group of storage elements in order to counteract an effect of the second set of stored charge levels on the values read from memory cells including at least some of the first group of storage elements because of field coupling between the storage elements, thereby to facilitate accurate reading of the first set of data from the first group of storage elements.

2. The method of claim 1, wherein a characteristic of the first set of stored charge levels that is affected by the second set of stored charge levels includes broadening an apparent distribution of those of the stored first set of levels that correspond to particular states of the first set of data, and wherein altering the first set of stored charge levels includes compacting the distribution of those of the stored first set of levels that correspond to particular states of the first set of data.

3. The method of claim 2, wherein compacting the distribution occurs after storing the second set of charge levels.

4. The method of claim 3, additionally comprising, prior to compacting the distribution of the stored first set of charge levels, reading the first set of data from the first group of storage elements.

5. The method of claim 2, wherein compacting the distribution occurs before storing the second set of charge levels.

6. The method of claim 1, wherein the storage elements are electrically conductive floating gates, and wherein the charge levels stored thereon affect conduction through memory cell transistors of which the storage elements are a part.

7. The method of claim 6, wherein more than two stored charge levels are defined for individual ones of the floating gates in order to store more than one bit of data on the individual floating gates.

8. The method of claim 1, wherein the non-volatile memory system in which the operating method is carried out includes an array of flash electrically erasable and programmable read only memory (EEPROM) cells having storage elements in the form of at least one floating gate per cell.

9. The method of claim 8, wherein the non-volatile memory system in which the operating method is carried out includes memory cells having two floating gates per cell.

10. The method of claim 8, wherein the non-volatile memory system in which the operating method is carried out includes memory cells organized in a NAND architecture.

11. The method of claim 1, wherein altering the first set of stored charge levels includes reading the first set of data from the first group of storage elements and thereafter restoring in the first group of storage elements the first set of charge levels corresponding to the read first set of data, whereby the restoring is accomplished without having to retain a copy of the first set of data initially stored in the first group of storage elements.

12. The method of claim 1, wherein the storage elements are operated to individually have a storage window divided into a plurality of defined ranges of charge levels representative of more than one bit of data and which are separated from one another, and the data are stored in the individual storage elements by incrementally changing the charge levels thereof until one of the charge level ranges is reached that corresponds to the data being stored therein, and further wherein storing the first set of charge levels in the first group of storage elements includes incrementally changing the charge levels of individual storage elements until one of a first set of reference storage levels corresponding to the data being stored is reached or exceeded, thereby to store the data with distributions of charge levels among the plurality of storage elements within defined ranges having widths resulting from incrementally changing the charge levels, and wherein altering the first set of charge levels stored in the first group of storage elements includes restoring charge levels in one portion of individual ones of said distributions by incrementally changing the charge levels of those individual storage elements until the stored charge levels are moved to another non-overlapping portion of their respective distributions, the amount of incremental change during storing being greater than the incremental change of storage levels during restoring.

13. The method of claim 12, wherein the memory system storage elements include conductive floating gates.

14. The method of claim 12, wherein the storage elements are connected in a NAND arrangement.

* * * * *